(12) United States Patent
Arnold et al.

(10) Patent No.: US 11,742,417 B2
(45) Date of Patent: Aug. 29, 2023

(54) POWER SEMICONDUCTOR DEVICE INCLUDING FIRST AND SECOND TRENCH STRUCTURES

(71) Applicant: Infineon Technologies AG, Neubiberg (DE)

(72) Inventors: Thorsten Arnold, Jesenwang (DE); Roman Baburske, Otterfing (DE); Ilaria Imperiale, Munich (DE); Alexander Philippou, Munich (DE); Hans-Juergen Thees, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 193 days.

(21) Appl. No.: 17/395,758

(22) Filed: Aug. 6, 2021

(65) Prior Publication Data

US 2022/0052190 A1    Feb. 17, 2022

(30) Foreign Application Priority Data

Aug. 13, 2020  (DE) .......................... 102020121309.3

(51) Int. Cl.
*H01L 29/739* (2006.01)
*H01L 29/78* (2006.01)
*H01L 29/423* (2006.01)
*H01L 29/66* (2006.01)
*H01L 29/40* (2006.01)

(52) U.S. Cl.
CPC ........ *H01L 29/7397* (2013.01); *H01L 29/401* (2013.01); *H01L 29/4236* (2013.01); *H01L 29/42304* (2013.01); *H01L 29/66348* (2013.01); *H01L 29/66734* (2013.01); *H01L 29/7813* (2013.01); *H01L 29/7831* (2013.01)

(58) Field of Classification Search
CPC ............... H01L 29/7397; H01L 29/401; H01L 29/42304; H01L 29/4236; H01L 29/66348; H01L 29/66734; H01L 29/7813; H01L 29/7831
USPC ....................................................... 257/331
See application file for complete search history.

(56) References Cited

U.S. PATENT DOCUMENTS

| | | | |
|---|---|---|---|
| 2012/0025874 A1* | 2/2012 | Saikaku | ............... H01L 29/407 257/330 |
| 2015/0206960 A1* | 7/2015 | Hirabayashi | ........ H01L 27/0727 257/140 |
| 2016/0336402 A1* | 11/2016 | Onishi | ............. H01L 29/66348 |
| 2020/0243657 A1 | 7/2020 | Chang | |

(Continued)

*Primary Examiner* — Igwe U Anya
(74) *Attorney, Agent, or Firm* — Murphy, Bilak & Homiller, PLLC

(57) ABSTRACT

A power semiconductor device first trench structures extending from a first main surface into a semiconductor body up to a first depth. The first trench structures extend in parallel along a first lateral direction. Each first trench structure includes a first dielectric and a first electrode. The power semiconductor device further includes second trench structures extending from the first main surface into the semiconductor body up to a second depth that is smaller than the first depth. The second trench structures extend in parallel along a second lateral direction and intersect the first trenches at intersection positions. Each second trench structure includes a second dielectric and a second electrode. The second dielectric is arranged between the first electrode and the second electrode at the intersection positions.

23 Claims, 12 Drawing Sheets

(56) References Cited

U.S. PATENT DOCUMENTS

2020/0251565 A1 8/2020 Su et al.
2020/0303525 A1* 9/2020 Iwakaji .............. H01L 29/4236

\* cited by examiner

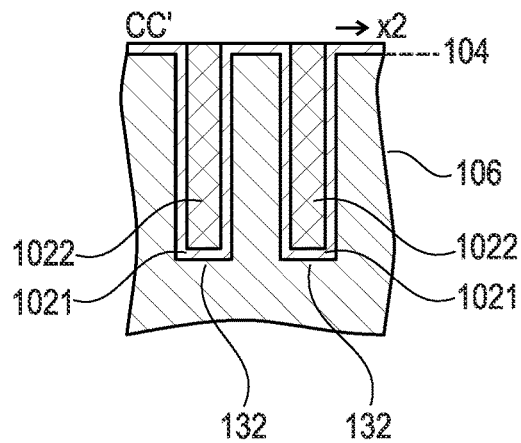 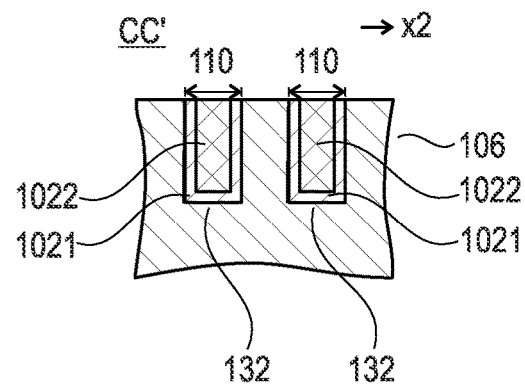
Fig. 13     Fig. 14A
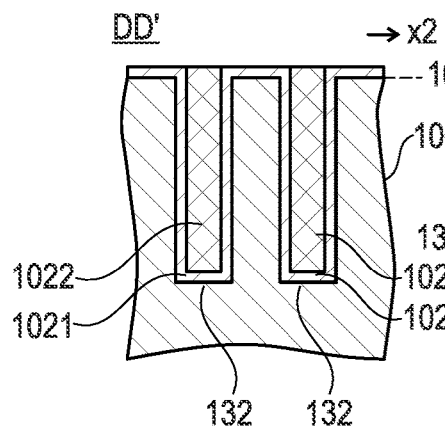 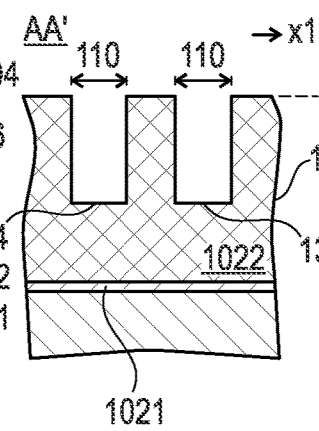 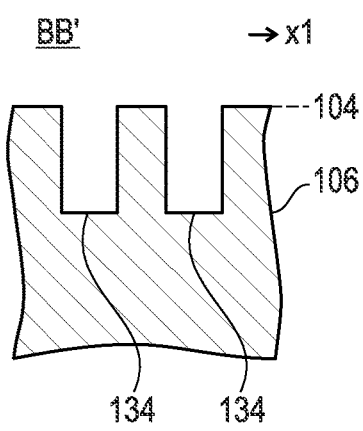
Fig. 14B     Fig. 14C     Fig. 14D
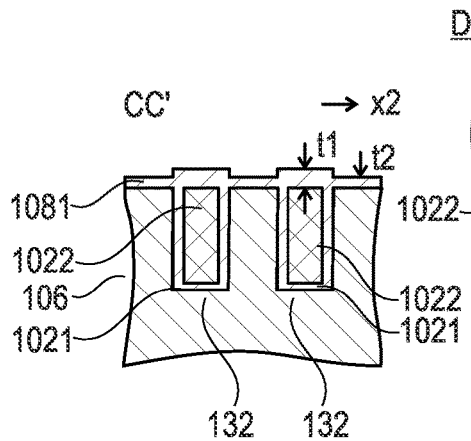 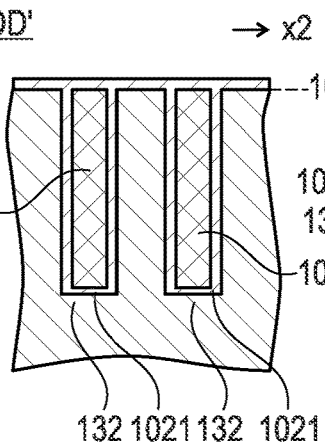 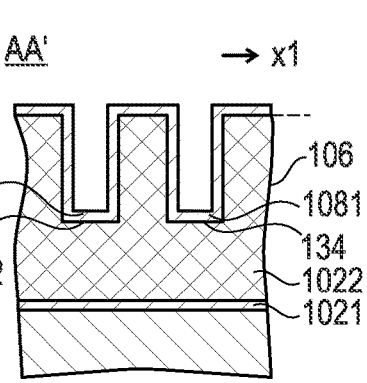
Fig. 15A     Fig. 15B     Fig. 15C

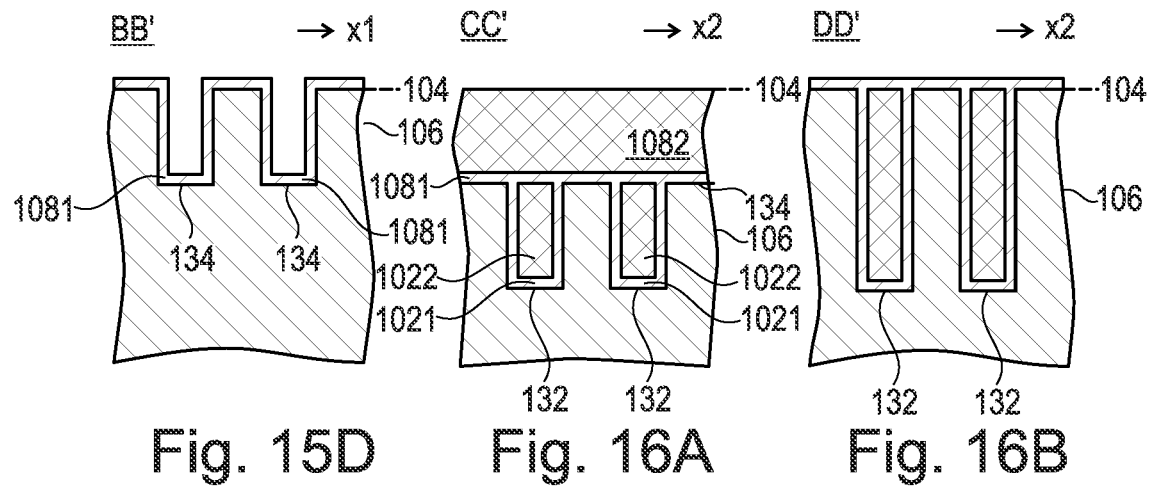
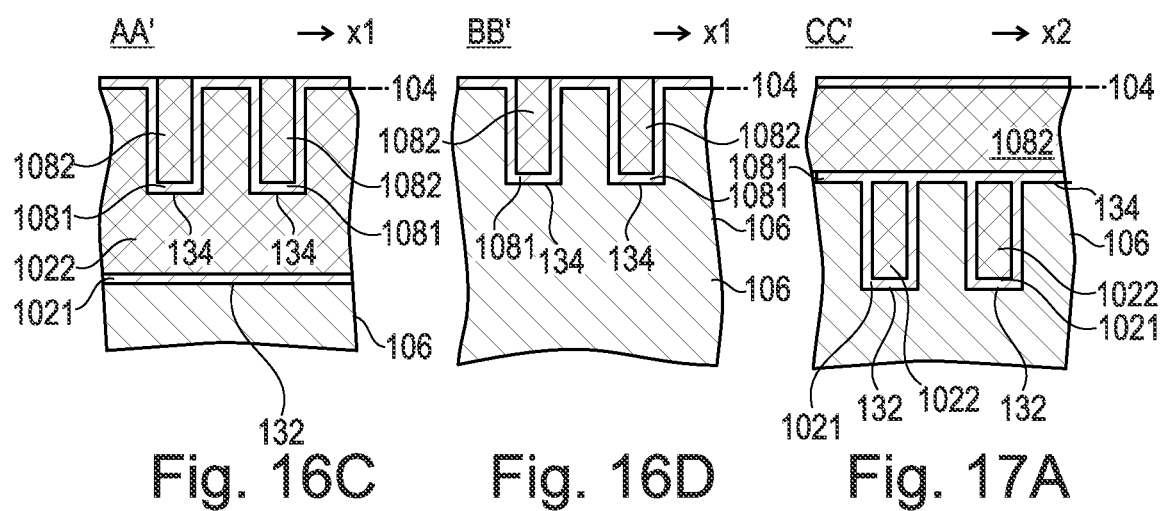
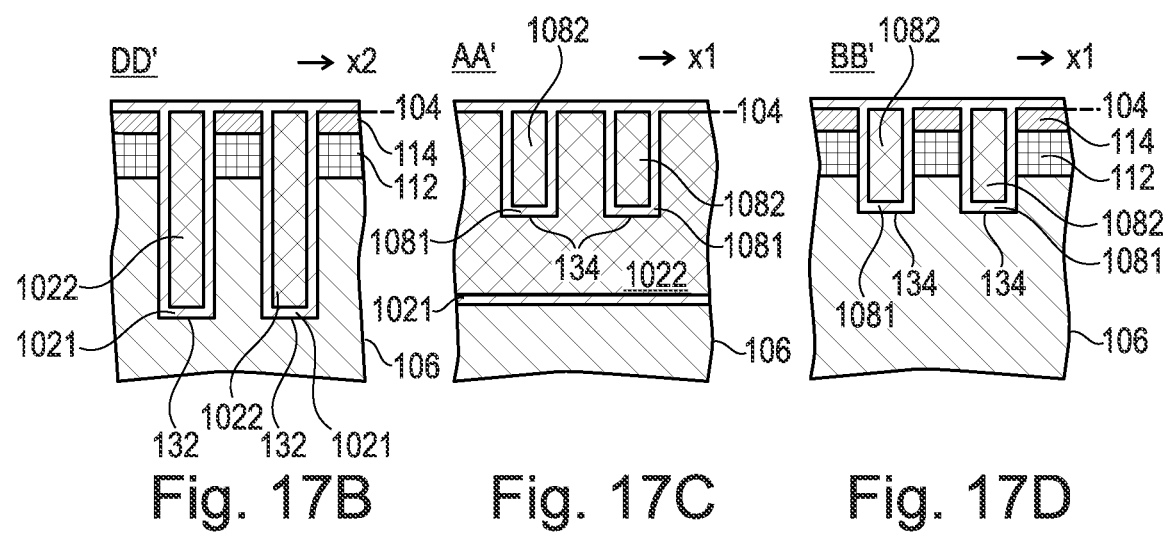

POWER SEMICONDUCTOR DEVICE INCLUDING FIRST AND SECOND TRENCH STRUCTURES

TECHNICAL FIELD

The present disclosure is related to semiconductor devices, in particular to power semiconductor devices including first and second trench structures.

BACKGROUND

In semiconductor diodes and semiconductor switching devices like IGBTs (insulated gate bipolar transistors) mobile charge carriers may flood a semiconductor region and may form a dense charge carrier plasma that yields a low forward resistance of the semiconductor diode or drift region of the IGBT. The charge carrier plasma is removed in a turn-off period when the device turns into blocking mode. The turn-off process contributes to the dynamic switching losses of the semiconductor device. Typically, a desaturation mechanism may attenuate the charge carrier plasma before switching the device in order to reduce the dynamic switching losses. It is desirable to provide semiconductor devices with improved switching characteristics.

SUMMARY

An example of the present disclosure relates to a power semiconductor device. The semiconductor device includes a plurality of first trench structures extending from a first main surface into in a semiconductor body up to a first depth. The plurality of first trench structures extends in parallel along a first lateral direction. Each of the plurality of first trench structures includes a first dielectric and a first electrode. The power semiconductor device further includes a plurality of second trench structures extending from the first main surface into in the semiconductor body up to a second depth that is smaller than the first depth. The plurality of second trench structures extends in parallel along a second lateral direction and intersects the plurality of first trenches at intersection positions. Each of the plurality of second trench structures includes a second dielectric and a second electrode. The second dielectric is arranged between the first electrode and the second electrode at the intersection positions.

Another example of the present disclosure relates to a method of manufacturing a power semiconductor device. The method includes forming a plurality of first trench structures extending from a first main surface into a semiconductor body up to a first depth. The plurality of first trench structures extends in parallel along a first lateral direction. Each of the plurality of first trench structures includes a first dielectric and a first electrode. The method further includes forming a plurality of second trench structures extending from the first main surface into the semiconductor body up to a second depth that is smaller than the first depth. The plurality of second trench structures extends in parallel along a second lateral direction and intersects the plurality of first trenches at intersection positions. Each of the plurality of second trench structures includes a second dielectric and a second electrode. The second dielectric is arranged between the first electrode and the second electrode at the intersection positions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of semiconductor devices, e.g. vertical power semiconductor devices and together with the description serve to explain principles of the embodiments. Further embodiments are described in the following detailed description and the claims.

FIGS. 11 to 18D are cross-sectional views for illustrating a method of manufacturing a power semiconductor device including first and second trench structures intersecting one another.

DETAILED DESCRIPTION

Figure 1:
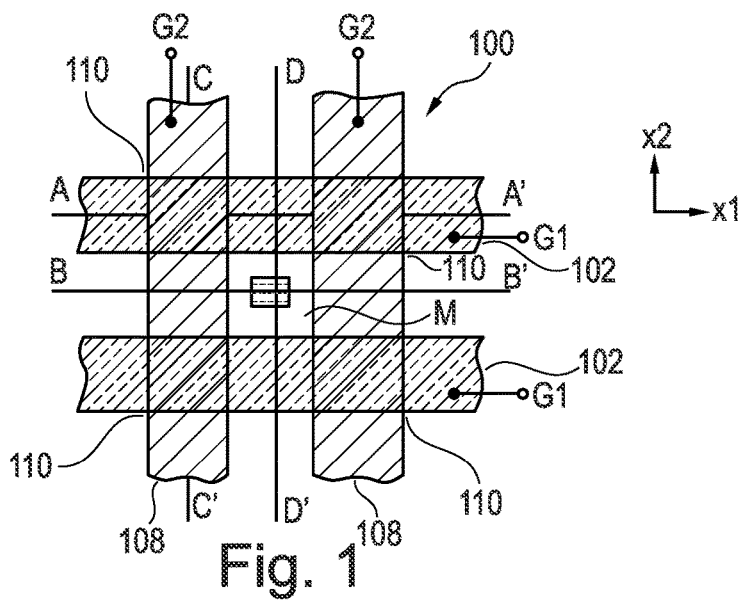
FIG. 1 is a schematic plan view for illustrating an example of a power semiconductor device including first and second trench structures intersecting one another.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction with a linear or almost linear current-voltage characteristic.

Ranges given for physical dimensions include the boundary values. For example, a range for a parameter y from a to b reads as a≤y≤b. A parameter y with a value of at least c reads as c≤y and a parameter y with a value of at most d reads as y≤d.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a power semiconductor device may include a plurality of first trench structures extending from a first main surface into a semiconductor body up to a first depth. The plurality of first trench structures may extend in parallel along a first lateral direction. Each of the plurality of first trench structures may include a first dielectric and a first electrode. The power semiconductor device may further include a plurality of second trench structures extending from the first main surface into the semiconductor body up to a second depth that is smaller than the first depth. The plurality of second trench structures may extend in parallel along a second lateral direction and intersect the plurality of first trenches at intersection positions. Each of the plurality of second trench structures may include a second dielectric and a second electrode. The second dielectric may be arranged between the first electrode and the second electrode at the intersection positions.

The power semiconductor device may be a vertical power semiconductor device having a load current flow between a first load terminal at the first main surface and a second load terminal at a second main surface opposite to the first main surface. The semiconductor device may be a vertical power semiconductor IGBT (insulated gate bipolar transistor), or a power semiconductor reverse conducting (RC) IGBT or a power semiconductor transistor such as a power semiconductor IGFET (insulated gate field effect transistor, e.g. a metal oxide semiconductor field effect transistor), or a power semiconductor diode. The vertical power semiconductor device may be configured to conduct currents of more than 1 A or more than 10 A or even more than 30 A and may be further configured to block voltages between load terminals, e.g. between emitter and collector of an IGBT, or between drain and source of a MOSFET in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski, MCZ, or a float zone (FZ) or an epitaxially deposited silicon semiconductor body.

The first main surface may be a level at an interface between the semiconductor body and a wiring area above the semiconductor body at a first side of the semiconductor body.

For example, the first electrode of the plurality of first trench structures may be electrically insulated from a surrounding part of the semiconductor body, e.g. from a body or source region, by the first dielectric in a first trench. The first dielectric may include one layer or a combination of layers, e.g. a layer stack of dielectric layers, for example oxide layers such as thermal oxide layers or deposited oxide layers, e.g. undoped silicate glass (USG), phosphosilicate glass (PSG), boron silicate glass (BSG), borophosphosilicate glass (BPSG), nitride layers, high-k dielectric layers or low-k dielectric layers. The first electrode may include one electrode material or a combination of electrode materials, for example a doped semiconductor material (e.g. a highly doped semiconductor material) such as doped polycrystalline silicon, metal or metal compounds. Although the first electrode of the plurality of first trench structures may be concurrently formed, the plurality of first trench structures may be divided into groups differing from one another with respect to an electric connection of the first electrode, for example.

Similar to the first dielectric of the plurality of first trench structures, the second dielectric may include one layer or a combination of layers, e.g. a layer stack of dielectric layers, for example oxide layers such as thermal oxide layers or deposited oxide layers, e.g. undoped silicate glass (USG), phosphosilicate glass (PSG), boron silicate glass (BSG), borophosphosilicate glass (BPSG), nitride layers, high-k dielectric layers or low-k dielectric layers. Similar to the first electrode in the plurality of first trench structures, the second electrode in the plurality of second trench structures may also be electrically insulated from a surrounding part of the semiconductor body by the second dielectric. The second electrode may include one electrode material or a combination of electrode materials, for example a doped semiconductor material (e.g. a highly doped semiconductor material) such as doped polycrystalline silicon, metal or metal compounds. Material(s) of the first and second electrode may be the same or (partly) differ from one another, for example. Although the second electrode in the plurality of second trench structures may be concurrently formed, the plurality of second trench structures may be divided into groups differing from one another with respect to an electric connection of the second electrode, for example.

All or some parts of each of plurality of first and/or second trench structures may be stripe-shaped, for example.

For example, the first depth may correspond to a vertical distance between a bottom of the first trench structure, e.g. a bottom of the first dielectric, and the first main surface. Likewise, the second depth may correspond to a vertical distance between a bottom of the second trench structure, e.g. a bottom of the second dielectric, and the first main surface.

At the intersection position, the second dielectric may directly adjoin the first electrode, e.g. may be in direct contact with the first electrode, or may be spaced from the first electrode at a vertical distance. The arrangement of the first electrode in the first trench structure and the second electrode in the second trench structure allows for an improved flexibility of carrier confinement, switching characteristic, channel design and contact schemes. The arrangement also allows for reducing or minimizing crosstalk between the two electrode signals.

For example, the semiconductor device may include a drift region between the first main surface and the second main surface opposite to the first main surface. An impurity concentration in the drift region may gradually or in steps increase or decrease with increasing distance to the first main surface at least in portions of its vertical extension. According to other examples the impurity concentration in the drift region may be approximately uniform. For IGBTs based on silicon, a mean impurity concentration in the drift region may be between $5 \times 10^{12}$ cm$^{-3}$ and $1 \times 10^{15}$ cm$^{-3}$, for example in a range from $1 \times 10^{13}$ cm$^3$ to $2 \times 10^{14}$ cm$^{-3}$. In the case of a semiconductor device based on SiC, a mean impurity concentration in the drift region may be between $5 \times 10^{14}$ cm$^{-3}$ and $1 \times 10^{17}$ cm$^{-3}$, for example in a range from $1 \times 10^{15}$ cm$^{-3}$ to $2 \times 10^{16}$ cm$^{-3}$. A vertical extension of the drift region may depend on voltage blocking requirements, e.g. a specified voltage class, of the vertical power semiconductor device. When operating the vertical power semiconductor device in voltage blocking mode, a space charge region may vertically extend partly or totally through the drift region depending on the blocking voltage applied to the vertical power semiconductor device. When operating the vertical power semiconductor device at or close to the specified maximum blocking voltage, the space charge region may reach or penetrate into a field stop region. The field stop region is configured to prevent the space charge region from further reaching to the cathode or collector at the second main surface of the semiconductor body. In this manner, the drift or base region may be formed using desired low doping levels and with a desired thickness while achieving soft switching for the semiconductor device thus formed.

For example, the first lateral direction may be perpendicular to the second lateral direction. Thus, the first and second trench structures may extend perpendicular to one another. According to other examples, an intersection angle between the first trench structure (or segments thereof) and the second trench structures (or segments thereof) may differ from 90°.

For example, a crossing angle or intersection angle between the first lateral direction and the second lateral direction may be larger than 45° and smaller than 90°.

For example, a thickness of the second dielectric at the intersection positions may be larger than a thickness of the first dielectric. This may allow for reducing or minimizing crosstalk between the two electrode signals, i.e. the signal applied to the first electrode and the signal applied to the second electrode. For example, a thickness of the second dielectric may vary along a bottom side of the second trench structure. A thickness of the second dielectric at a bottom side of the second trench structure at the intersection positions may also be greater than in a segment between neighboring intersection positions. For example, a thickness of the second dielectric at a bottom side of the second trench structure at the intersection positions may also be greater than at a sidewall of the second trench structure. In a segment of the second trench structure between neighboring intersection positions, a thickness of the second dielectric at a bottom side of the second trench structure may be equal to a thickness of the second dielectric at a sidewall of the second trench structure, for example. A thickness of the second dielectric at a bottom side of the second trench structure at the intersection positions may, for example, be in a range of 1.5 to 5, or 2 to 4 times a thickness of the first dielectric at a bottom side of the first trench structure.

For example, the first electrode in a first group of the plurality of first trench structures and the first electrode in a second group of the plurality of first trench structures may be electrically disconnected. For example, the first electrode in the first group and the first electrode in the second group may be driven by different signals, for example.

For example, the first electrode in the first group of the plurality of first trench structures may be gate electrode electrically connected to a first gate terminal, and the first electrode in the second group of the plurality of first trench structures may be an electrode electrically connected to a reference terminal, e.g. an emitter/source terminal of an IGBT or an anode terminal of a diode. The first gate terminal may be formed in a wiring area that may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an intermediate dielectric may be arranged. Contact plug(s) or contact line(s) may be formed in openings in the intermediate dielectric to electrically connect parts, e.g. metal lines or contact areas, of different wiring levels to one another. The first gate terminal may be formed by one or more conductive elements in the wiring area, for example. Likewise, the reference terminal may be formed by one or more conductive elements in the wiring area.

For example, the second electrode in a first group of the plurality of second trench structures and the second electrode in a second group of the plurality of second trench structures may be electrically disconnected. For example, the second electrode in the first group and the second electrode in the second group may be driven by different signals, for example.

For example, the second electrode in the first group of the plurality of second trench structures may be a gate electrode electrically connected to a first gate terminal.

For example, the second electrode in the second group of the plurality of second trench structures may be an electrode electrically connected to a reference terminal.

For example, the first electrode in a first group of the plurality of first trench structures may be a first gate electrode electrically connected to a first gate terminal. The second electrode in a first group of the plurality of second trench structures may be a second gate electrode electrically connected to a second gate terminal. This may allow for providing a dual split gate power semiconductor device, for example.

For example, the power semiconductor device may further include a gate driver. The gate driver is configured to drive the first sub-electrode by a first gate driving signal, and drive the second sub-electrode by a second gate driving signal. A rising edge of the first gate driving signal and a rising edge of the second gate driving signal are offset by a first delay time period. For example, the first delay time period vanishes. A decaying edge of the first gate driving signal and a decaying edge of the second gate driving signal are offset by a second delay time period.

For example, the power semiconductor device may further include a plurality of mesa regions. Each of the plurality of mesa regions may be laterally confined along the second lateral direction by neighboring two of the plurality of first trench structures. Moreover, each of the plurality of mesa regions may be further laterally confined along the first lateral direction by neighboring two of the plurality of second trench structures. At least some of the plurality of mesa regions may differ in at least one of an electric contact on the mesa region, and a number of source-sub regions arranged in the mesa region. This may allow for more flexibility in channel design.

For example, at least one of the plurality of mesa regions includes a number of n source sub-regions, n being an integer ranging from 1 to 4, and, for 2≤n≤4, the n source sub-regions directly adjoin to different ones of the plurality of first and second trench structures. For example, in a first group of mesa regions neither source sub-regions may be present nor an electric contact at the first main surface. In other words, source sub-regions and an electric contact at the first main surface mesa regions are absent in the mesa regions of the first group. In a second group of mesa regions no source sub-regions may be present but an electric contact at the first main surface. In a third group of mesa regions one source sub-region may be present and an electric contact at the first main surface. In a fourth group of mesa regions two source sub-regions may be present and an electric contact at the first main surface. In a fifth group of mesa regions three source sub-regions may be present and an electric contact at the first main surface. In a sixth group of mesa regions four source sub-regions may be present and an electric contact at the first main surface. In the power semiconductor device, mesa regions of some or all of the above first to sixth groups may be present. Moreover, the shape of the source sub-regions may also differ among same and/or different groups, for example.

For example, at least one of the plurality of mesa regions includes a source region, and a circumference of the source region at the first main surface coincides with a circumference of the mesa region at the first main surface.

For example, at least one of the plurality of mesa regions includes four source sub-regions, and the four source sub-regions are separated at the first main surface by a contact in the shape of a cross. Each of the four sub-regions may adjoin only one trench structure or two trench structures.

For example, a first pitch between the plurality of first trench structures may differ from a second pitch between the plurality of second trench structures.

A method of manufacturing a power semiconductor device may include forming a plurality of first trench structures extending from a first main surface into a semiconductor body up to a first depth. The plurality of first trench structures may extend in parallel along a first lateral direction. Each of the plurality of first trench structures may include a first dielectric and a first electrode. The method may further include forming a plurality of second trench structures extending from the first main surface into the semiconductor body up to a second depth that is smaller than the first depth. The plurality of second trench structures may extend in parallel along a second lateral direction and intersect the plurality of first trenches at intersection positions. Each of the plurality of second trench structures may include a second dielectric and a second electrode. The second dielectric may be arranged between the first electrode and the second electrode at the intersection positions.

For example one or more dry and/or wet etch processes may be used for forming first trenches into the semiconductor body, the first trenches being associated with the first trench structures. Likewise, one or more dry and/or wet etch processes may be used for forming second trenches into the semiconductor body, the second trenches being associated with the second trench structures.

For example, forming the plurality of second trench structures may include forming a plurality of second trenches by etching a part of the first electrode and the first dielectric and a part of the semiconductor body.

For example, the method may further include forming source and body regions after forming the first and second trench structures.

The examples and features described above and below may be combined.

Functional and structural details described with respect to the examples above shall likewise apply to the exemplary examples illustrated in the figures and described further below.

The examples and features described above and below may be combined.

In the following, further examples of semiconductor devices are explained in connection with the accompanying drawings. Functional and structural details described with respect to the examples above shall likewise apply to the exemplary embodiments illustrated in the figures and described further below.

FIG. 1 schematically and exemplarily shows a section of a plan view of a power semiconductor device 100, e.g. a unit cell. FIGS. 2A, 2B, 2C, 2D are schematic and exemplary cross-sectional views along intersecting lines AA', BB', CC', DD' of FIG. 1.

Referring to the schematic views of FIGS. 1 and 2A to 2D, the power semiconductor device 100 includes a plurality of first trench structures 102 extending from a first main surface 104 into a semiconductor body 106 up to a first depth d1. The plurality of first trench structures 102 extend in parallel along a first lateral direction x1. Each of the plurality of first trench structures 102 includes a first dielectric 1021 and a first electrode 1022. In the examples of FIGS. 1, 2A to 2D, the illustrated first electrode 1022 is electrically coupled to a first gate terminal G1, e.g. via a first gate connection line surrounding or partly surrounding an active cell area of the vertical power semiconductor device 100. A plurality of second trench structures 108 extends from the first main surface 104 into the semiconductor body 106 up to a second depth d2 that is smaller than the first depth d1. The plurality of second trench structures 108 extend in parallel along a second lateral direction x2 and intersect the plurality of first trenches at intersection positions 110. Each of the plurality of second trench structures 108 includes a second dielectric 1081 and a second electrode 1082. The second dielectric 1081 is arranged between the first electrode 1022 and the second electrode 1082 at the intersection positions 110. In the examples of FIGS. 1, 2A to 2D, the illustrated second electrode 1082 is electrically coupled to a second gate terminal G2, e.g. via a second gate connection line surrounding or partly surrounding an active cell area of the vertical power semiconductor device 100.

The power semiconductor device 100 may be a vertical power semiconductor device. In a vertical semiconductor device, a load current may flow along the vertical direction y between a first load terminal L1 at the first surface 104 and a second load contact terminal L2 at a second surface opposite to the first surface 104, for example. The first load terminal L1 may be a source terminal of an IGFET or an emitter terminal of an IGBT or reverse conducting (RC) IGBT or an anode terminal of a diode, for example. The second load terminal L2 may be a drain terminal of an IGFET or a collector terminal of an IGBT or RC IGBT or a cathode terminal of a diode, for example.

The first load terminal L1 may further include or consist of a conductive material or a combination of conductive materials, for example a doped semiconductor material (e.g., a degenerate doped semiconductor material) such as doped polycrystalline silicon, metal or metal compound, for example. The first load terminal L1 may also include a combination of these materials, e.g. a liner or adhesion material and an electrode material. Exemplary contact materials include one or more of titanium nitride (TiN) and tungsten (W), aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd), for example. The first load terminal L1 may constitute or be part of a wiring area formed over the semiconductor body 106. The wiring area may include one, two, three or even more wiring levels that may include patterned or non-patterned metal layers and interlayer dielectrics arranged between the patterned or non-patterned metal layers. Vias may electrically interconnect the different wiring levels, for example. A part of the first load terminal L1, e.g. contacts plug(s), may directly adjoin the semiconductor body 106 at the first surface 104.

The power semiconductor device 100 further includes a plurality of mesa regions M. Each of the plurality of mesa regions M is laterally confined along the second lateral direction x2 by neighboring two of the plurality of first trench structures 102, and is further laterally confined along the first lateral direction x1 by neighboring two of the plurality of second trench structures 108, wherein at least some of the plurality of mesa regions M differ.

Some mesa regions may differ from other mesa regions in at least one of an electric contact on the mesa region, and a number and arrangement of source-sub regions arranged in the mesa region, for example. In addition or as an alternative, some mesa regions may also differ from other mesa regions in that the electrodes of the first and/or second trench structures adjoining to or confining these mesa regions are driven by different electrode signals. Mesa regions differing in structure and/or driving of electrodes surrounding the mesa regions may also be referred to as mesa regions of different configurations. Designing transistor or diode cells based on mesa regions of different configurations as described above may allow for adjusting carrier confinement, channel width, switching speed, switching losses, latch-up ruggedness and flexibility of mesa contact schemes, for example.

In the exemplary part of the power semiconductor device 100 illustrated in FIGS. 2A to 2D, the illustrated mesa regions M have a similar configuration. In each of the mesa regions M, a p-doped body region 112 and an n$^+$-doped source region 114 are formed. A circumference of the source region 114 at the first main surface 104 coincides with a circumference of the mesa region M at the first main surface 104, for example. In another example useful when the plurality of first trench structures and the plurality of second trench structures are at different gate signals, four sub-source regions may be formed. The circumference of two sub-source regions may be given by the electric contact and a neighboring trench of the plurality of first trench structures and may not touch or be in contact with the plurality of second trench structures. Likewise, the circumference of two other sub-source regions may be given by the electric contact and a neighboring trench of the plurality of second trench structures and may not touch the plurality of first trench structures.

A groove contact 116 extends into the semiconductor body 106 and is electrically connected to the body region 112 and to the source region 114. As an alternative or in addition to a groove contact, a planar contact may be formed (not illustrated). The planar contact may be electrically connected to the source region 114 and to the body region 112 or to a p$^+$-doped body contact region at the first main surface 104, for example or the bottom of the contact groove, for example.

A conductivity of a channel close to an interface between the body region 112 and the first dielectric 1021 and/or second dielectric 1081 may be controlled by a voltage applied to the first electrode 1022 and/or second electrode 1082, for example.

Figure 2A:
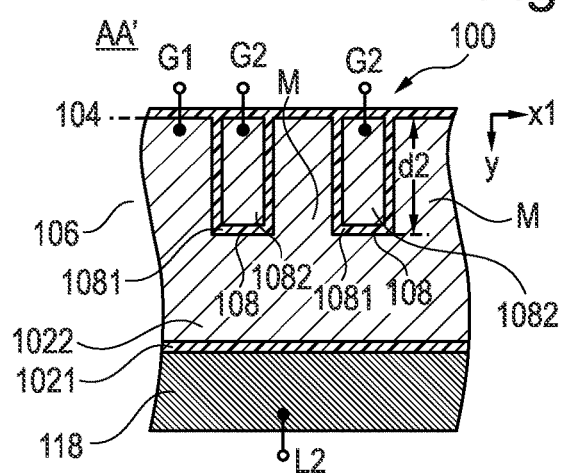
FIGS. 2A to 2D are schematic cross-sectional views along intersecting lines AA', BB', CC', DD' of FIG. 1 for illustrating an example of a power semiconductor device.
Figure 2B:
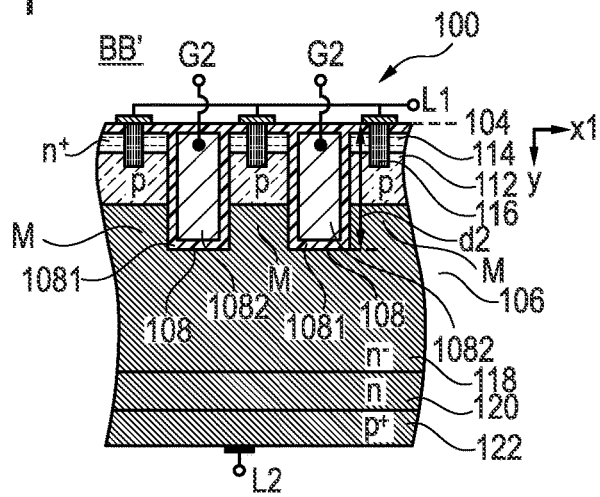
Figure 2C:
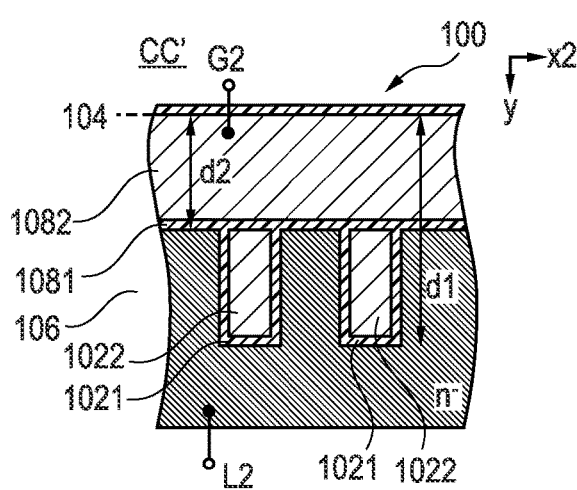
Figure 2D:
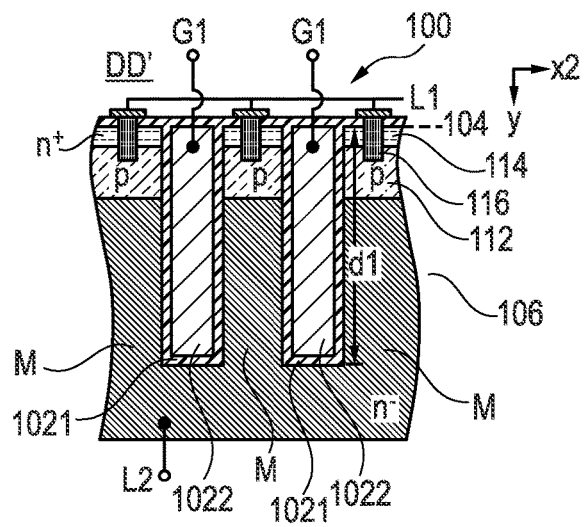

Referring to FIG. 2B, the power semiconductor device 100 further includes an n$^-$-doped drift region 118. For example, an impurity concentration in the drift region 118 may gradually or in steps increase or decrease with increasing distance to the first main surface at least in portions of its vertical extension. According to other examples the impurity concentration in the drift region may be approximately uniform. For IGBTs based on silicon, a mean impurity concentration in the drift region may be between $5\times10^{12}$ cm$^{-3}$ and $1\times10^{15}$ cm$^{-3}$, for example in a range from $1\times10^{13}$ cm$^{-3}$ to $2\times10^{14}$ cm$^{-3}$. In the case of a semiconductor device based on SiC, a mean impurity concentration in the drift region may be between $5\times10^{14}$ cm$^{-3}$ and $1\times10^{17}$ cm$^{-3}$, for example in a range from $1\times10^{15}$ cm$^3$ to $2\times10^{16}$ cm$^{-3}$. A vertical extension of the drift region may depend on voltage blocking requirements, e.g. a specified voltage class, of the vertical power semiconductor device. When operating the vertical power semiconductor device in voltage blocking mode, a space charge region may vertically extend partly or totally through the drift region 118 depending on the blocking voltage applied to the vertical power semiconductor device. When operating the vertical power semiconductor device 100 at or close to the specified maximum blocking voltage, the space charge region may reach or penetrate into an optional n-doped field stop region 120 (see FIG. 2B). The field stop region 120 is configured to prevent the space charge region from further reaching to the cathode or collector at the second main surface of the semiconductor body 106. In this manner, the drift region 118 may be formed using desired low doping levels and with a desired thickness while achieving soft switching for the power semiconductor device thus formed.

Since the field stop region 120 aims at preventing the space charge region from reaching the collector (cathode) at the second main surface of the semiconductor body of an IGBT (diode) in a voltage blocking mode at or around maximum specified voltage blocking capabilities, a mean net impurity concentration in the field stop layer 120 may be higher than in the drift region 118 by at least one order of magnitude, for example.

Referring to FIG. 2B, the illustrated power semiconductor device further includes a collector region or hole injection region 122 electrically connected to the second load terminal L2 at the second main surface.

Figure 3A:
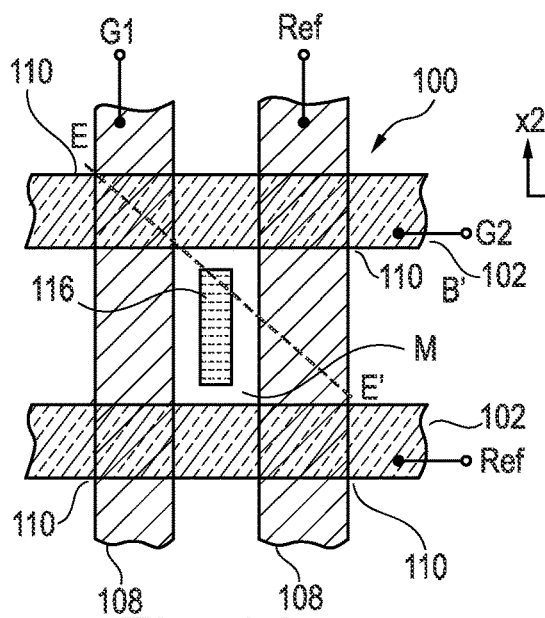
FIG. 3A is a schematic plan view and FIG. 3B along an intersecting line from the crossings of CC' and AA' to the crossings of BB' and DD' in FIG. 1 in the case that the pitch p1 is two times the pitch p1 and if the contact region 116 is extended in the negative x2-direction as shown in FIG. 3A (or along an intersecting line EE' in FIG. 3A) illustrating an example of a dual gate configuration of a power semiconductor device.
Figure 3B:
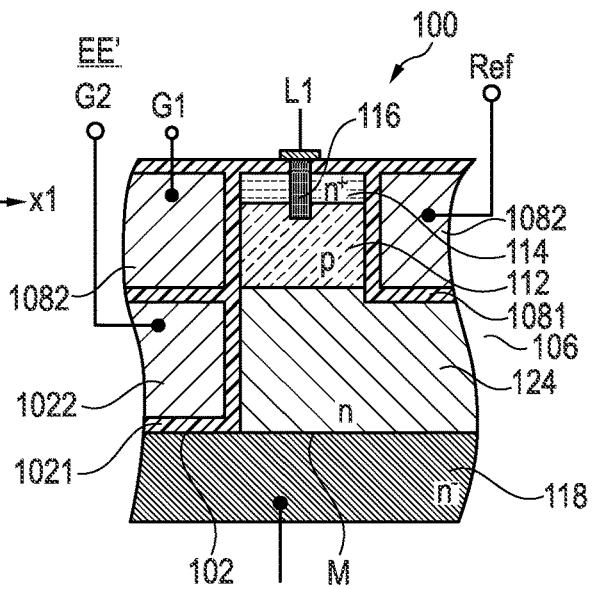
FIG. 3C is a schematic graph for illustrating gate driving signals for a dual gate configuration of a power semiconductor device.
FIGS. 3D to 3G are schematic plan views for illustrating other examples of power semiconductor devices including a dual gate configuration.

The schematic cross-sectional view of FIG. 3B illustrates another example of a power semiconductor device 100 along intersecting line EE' of FIG. 3A.

The power semiconductor device includes an n-doped current spread region 124 between the body region 112 and the drift region 118, which may or may not extend up to the drift region 118. At the intersection of the dielectric 1021 or 1081 and the current spread region 124 a channel may form.

In the example of FIG. 3B, the second trench structures 108 may differ from one another with respect to a number of sub-electrodes and/or electric connection of the electrodes. In a first group of the plurality of second trench structures 108, the second electrode 1082 is electrically coupled to a reference terminal Ref, e.g. the first load terminal L1 or emitter/source terminal. The second electrode 1082 of a second group of second trench structures 108 is electrically connected to a first gate terminal G1 of a dual gate electrode. The mesa region M between the second trench structures 108 illustrated in FIG. 3B is an active mesa region configured to conduct a load current by controlling a conductivity of a channel via the first gate terminal G1, for example.

Similarly, the first trench structures 102 may differ from one another with respect to a number of sub-electrodes and/or electric connection of the electrodes. In a first group of the plurality of first trench structures 102, the first electrode 1022 may be electrically coupled to a reference terminal, e.g. the first load terminal L1 or emitter/source terminal (not illustrated in FIG. 3B). The first electrode 1022 of the second group of first trench structures 102 may be connected to a second gate terminal G2 of a dual gate electrode. The mesa region M between the first trench structures 102 illustrated in FIG. 3B is an active mesa region configured to conduct a load current by controlling a conductivity of a channel via the second gate terminal G2, for example.

While the first gate terminal G1 may be used to control a conductivity of an electron channel at an interface between the p-doped body region 112 and the first dielectric 1081 adjoining the first electrode 1082, the second gate terminal G2 may be used to control a conductivity of a hole channel at an interface between the n-doped current spread region 124 and the first dielectric 1021 adjoining the second electrode 1022.

In some other examples, the mesa region M may also be arranged between two second trench structures 108 both having a same configuration, e.g. a second electrode electrically coupled to the first gate terminal G1.

Figure 3C:
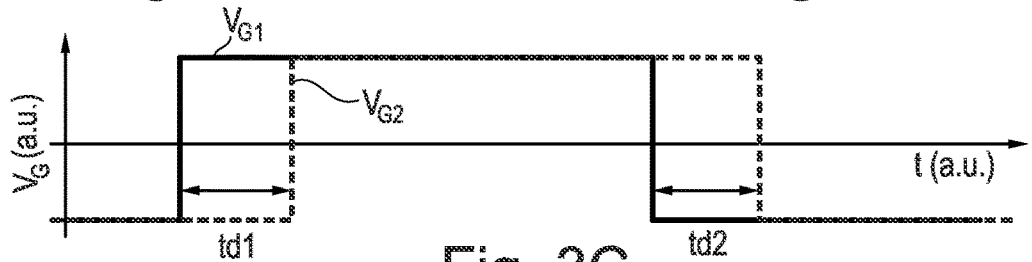

An exemplary gate driving sequence for a dual gate configuration as illustrated in FIGS. 3A and 3B is schematically shown in the graph of FIG. 3C. The graph illustrates gate driving signals $V_G$ versus time t.

A first gate driving signal $V_{G1}$ is applied to the second group of second trench structures 1082 for controlling the conductivity of an electron channel, and a second gate driving signal $V_{G2}$ is applied to the second group of first trench structures 1022 for controlling the conductivity of a hole channel. A rising edge of the first gate driving signal $V_{G1}$ and a rising edge of the second gate driving signal $V_{G2}$ are offset by a first delay time period td1. A falling edge of the first gate driving signal $V_{G1}$ and a falling edge of the second gate driving signal $V_{G2}$ are offset by a second delay time period td2. For example, the algebraic signs of the first and second delay time period td1, td2 may be equal, e.g. positive. For example, the second gate signal $V_{G2}$ may rise later by td1 than the first gate signal $V_{G1}$, and the second gate signal $V_{G2}$ may fall later by td2 than the first gate signal $V_{G1}$. In some examples, td1 may be equal to td2, i.e. a pulse length of the first gate signal $V_{G1}$ may be equal to a pulse length of the second gate signal $V_{G2}$.

Figure 3D:
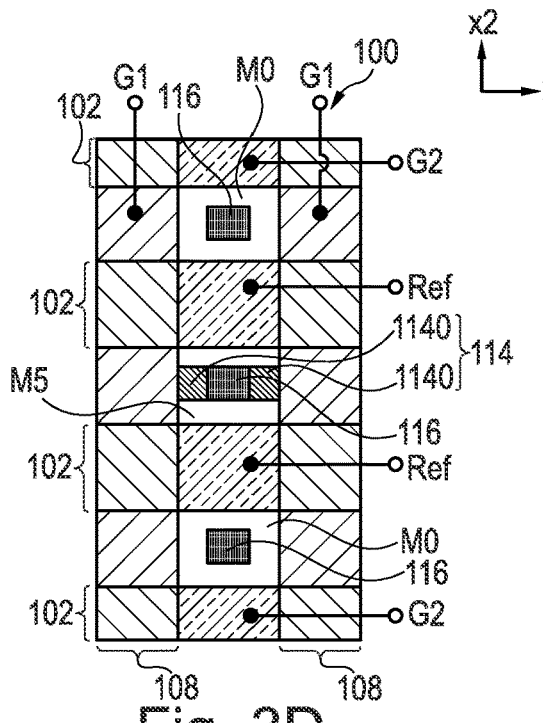
Figure 3E:
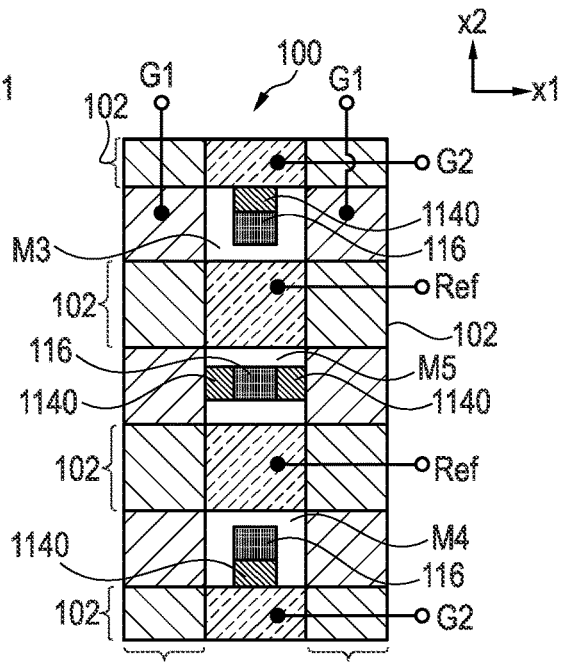

The schematic top views of FIGS. 3D and 3E are schematic illustrations of examples of power semiconductor devices 100 including a dual gate configuration as is described with reference to FIGS. 3A and 3C.

Referring to FIG. 3D, the power semiconductor device 100 includes the first trench structures 102 that partly differ from one another with respect to an electric connection of the first electrodes, which can be all connected to G2 or to both G2 and reference terminal Ref simultaneously, for example. The second group of electrodes 1082 of second trench structures 108 is connected to the first gate terminal G1 while the second group of electrodes 1022 of first trench structures 102 is connected to the second gate terminal G2. The power semiconductor device 100 includes the second trench structures 108 that partly differ from one another with respect to an electric connection of the second electrodes, which can be all on G1 or reference terminal Ref or on both G1 and reference terminal Ref simultaneously, for example.

The power semiconductor device 100 of FIG. 3D includes mesa regions M0 without any source regions or source sub-regions but a contact 116 on the mesa regions M0. The power semiconductor device 100 of FIG. 3D further includes a mesa region M5 having two source sub-regions 1140 adjoining different ones of the second trench structures 108.

The power semiconductor device 100 of FIG. 3E includes, in addition to the mesa region M5 described with reference to FIG. 3D, mesa regions M3, M4. The mesa region M3 includes a source sub-region 1140 that has a different orientation with respect to the contact 116 than the source sub-region 1140 of the mesa region M4. Moreover, the orientations of the source sub-regions 1140 of the mesa regions M3, M4 with respect to the contact 116 also differ from the orientations of the source sub-regions 1140 of the mesa region M5. Thereby, a load current may have a current component along a channel formed at sidewalls of the second trench structures 108, and may further have a current component along a channel formed at sidewalls of the first trench structures 102 at the group of first trench structures connected to G2. For example, the first group of trenches of the first trench structures is connected to reference terminal Ref and the second group of trenches of the first trench structures is connected to G2. For example, the first group of trenches of first trench structures adjoins the mesa region M5.

Figure 3F:
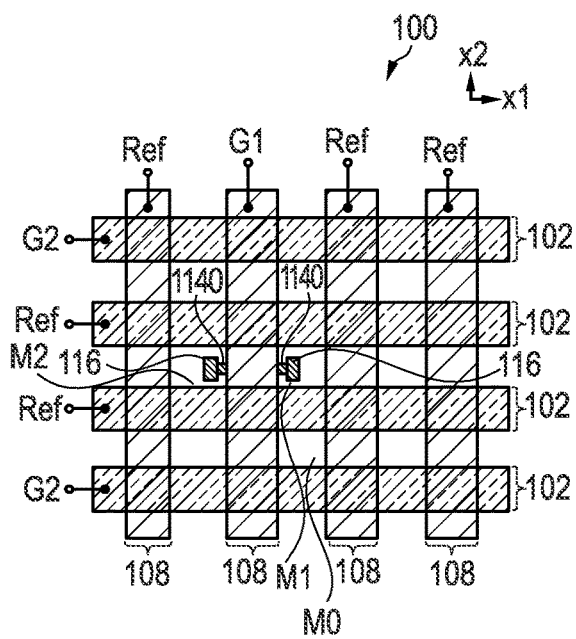
Figure 3G:
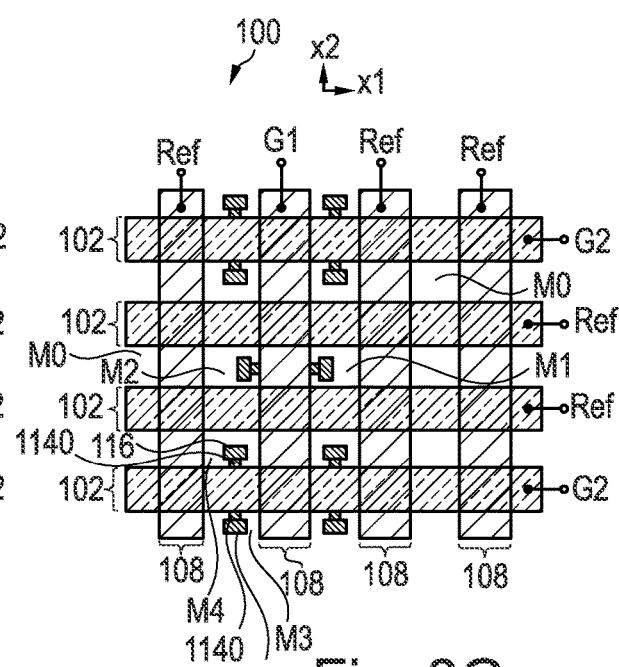

Further examples of power semiconductor devices 100 based on the dual gate concept are illustrated in the schematic plan views of FIGS. 3F and 3G.

In the example of FIG. 3F, in a first group of the plurality of second trench structures 108, the second electrode is electrically coupled to the reference terminal Ref, and in a second group of the plurality of second trench structures 108, the second electrode is electrically coupled to the first gate terminal G1. The second trench structure 108 including the electrode electrically coupled to the first gate terminal G1 is arranged between mesa regions M1 and M2. The mesa region M0 is a mesa region without a contact and without a source region. Each of the mesa regions M1, M2 includes a source sub-region 1140 adjoining the second trench structure 108 including the electrode electrically coupled to the first gate terminal G1. Thereby, a load current flow can be controlled at the sidewall of second trench structure 108 including the electrode electrically coupled to the first gate terminal G1. In a first group of the plurality of first trench structures 102, the first electrode is electrically coupled to the reference terminal Ref, and in a second group of the plurality of first trench structures 102, the first electrode is an electrode electrically coupled to the second gate terminal G2. The first trench structure 102 including the electrode electrically coupled to the second gate terminal G2 is arranged such that it never adjoins the mesa regions M1 and M2.

The power semiconductor device 100 of FIG. 3G includes, in addition to the mesa regions M0, M1, M2 illustrated in FIG. 3F, mesa regions M3, M4. Similar to the power semiconductor device 100 described with reference to FIG. 3E, the power semiconductor device 100 illustrated in FIG. 3G includes mesa regions M3 and M4. Each of the mesa regions M3 has a source sub-region 1140 that has a different orientation with respect to the contact 116 than the source sub-region 1140 of mesa regions M1, M4 and M2. Moreover, the orientations of the source sub-regions 1140 of the mesa regions M4 with respect to the contact 116 also differ from the orientations of the source sub-regions 1140 of the mesa regions M1, M2 and M3.

Figure 4A:
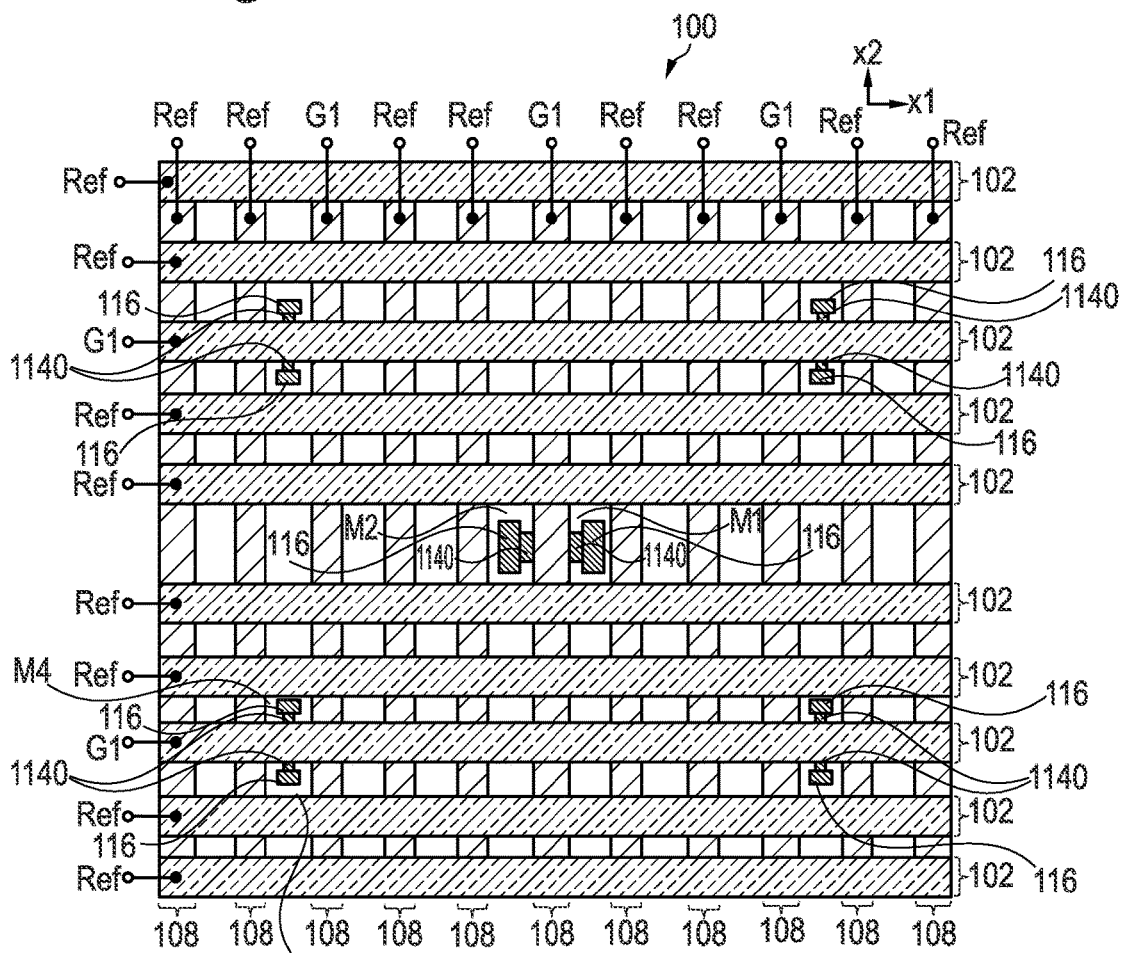
FIGS. 4A to 4C are schematic plan views for illustrating examples of power semiconductor devices including trench electrodes in the first and second trench structures that are electrically coupled to only a single gate terminal or to a reference terminal.

Referring to the schematic plan view of FIG. 4A, each of the first trench structures 102 and the second trench structures 108 includes a first group of electrodes electrically coupled to the reference terminal Ref and a second group of electrodes electrically coupled to the first gate terminal G1. Source sub-regions 1140 in mesa regions M1, M2 adjoin the second trench structure 108 having the electrode electrically coupled to the first gate terminal G1. Thus, mesa regions M1, M2 are active mesa regions configured to conduct a part of the load current between the load terminals L1 and L2. Source sub-regions 1140 in mesa regions M3, M4 adjoin the first trench structure 102 having the electrode electrically coupled to the first gate terminal G1. Thus, mesa regions M3, M4 are also active mesa regions configured to conduct another part of the load current between the load terminals L1 and L2.

Figure 4B:
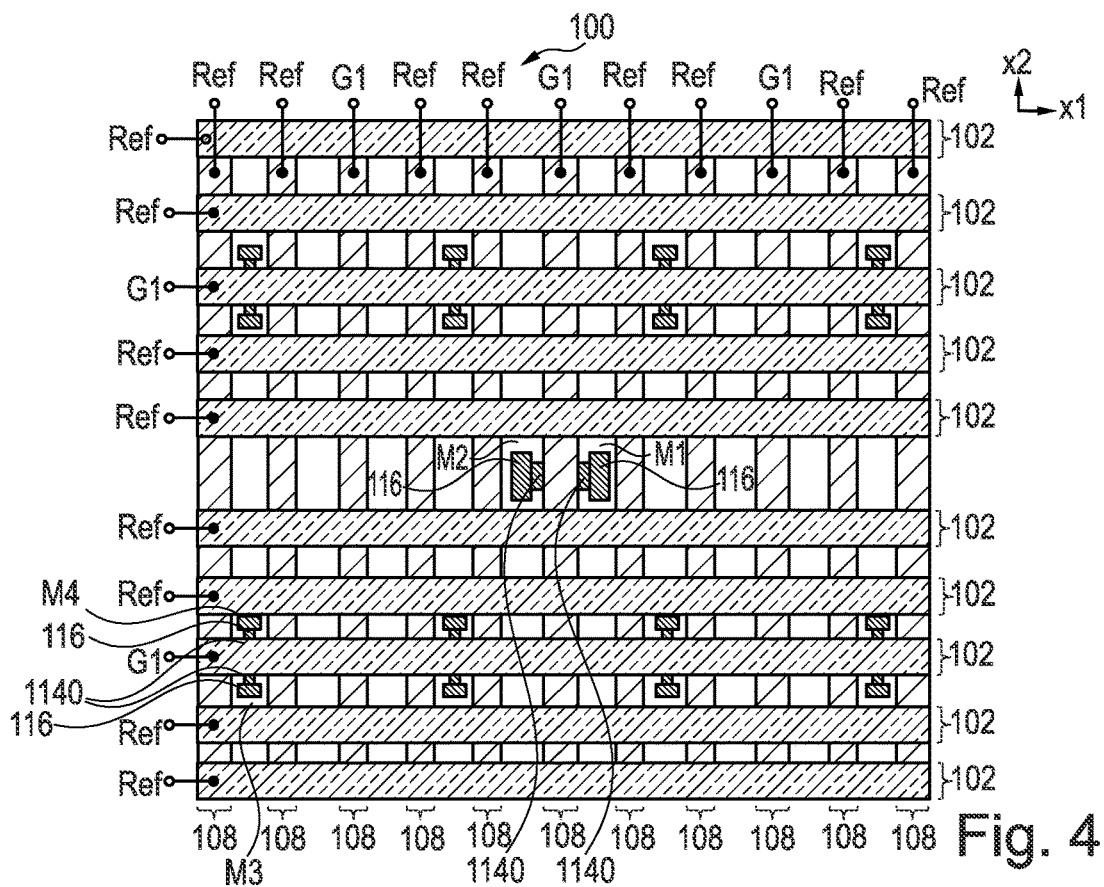

The schematic plan view of FIG. 4B illustrates another example of a power semiconductor device 100. The power semiconductor device 100 of FIG. 4B differs from the power semiconductor device 100 illustrated in FIG. 4A with respect to the arrangement of active mesa regions having channels formed at the first trench structures 102. While the mesa regions M3, M4 of the example of FIG. 4A adjoin a second trench structure 108 having the electrode electrically coupled to the first gate terminal G1, the mesa regions M3, M4 of the example illustrated in FIG. 4B are arranged between two second trench structures 108 having the electrodes electrically coupled to the reference terminal Ref.

Figure 4C:
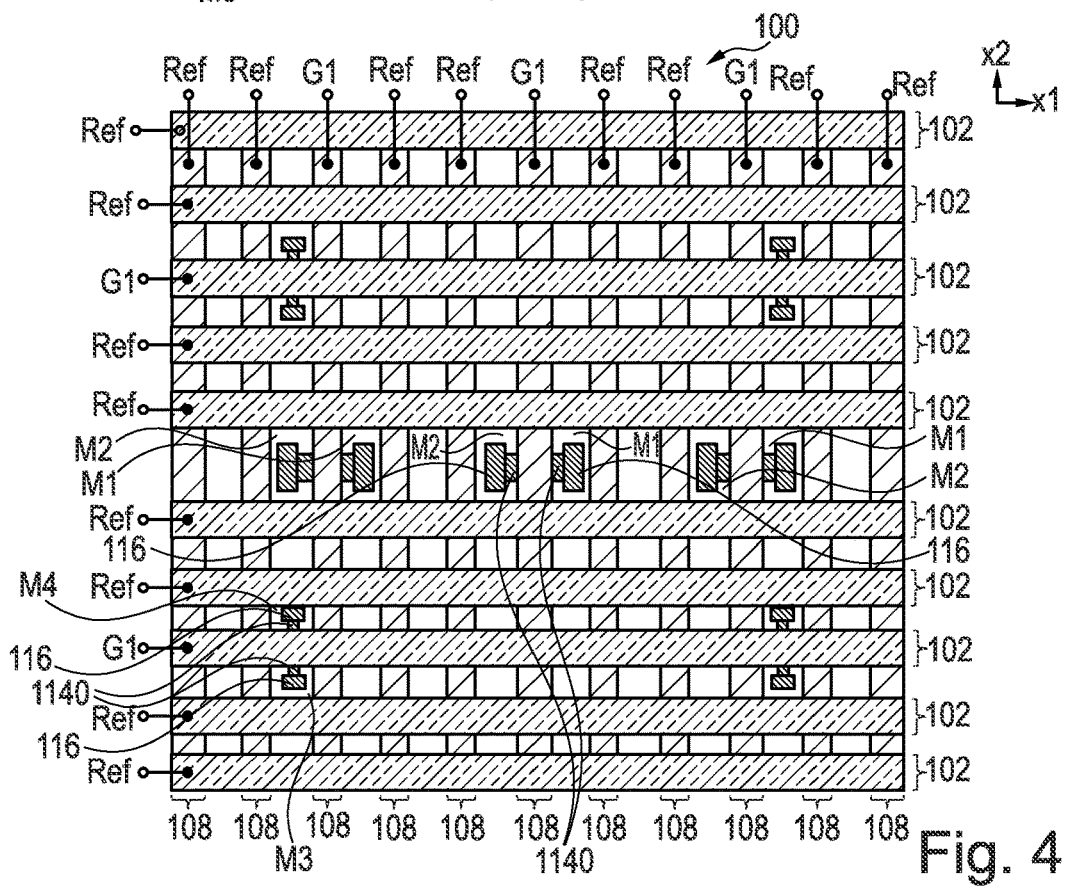

The schematic plan view of FIG. 4C illustrates another example of a power semiconductor device 100. The power semiconductor device 100 of FIG. 4C differs from the power semiconductor device 100 illustrated in FIGS. 4A, 4B with respect to the arrangement of inactive or dummy second gate structures 108. While the portions of the power semiconductor devices 100 illustrated in FIGS. 4A, 4B include inactive or dummy second trench structures 108 without active mesa regions M1 or M2 adjoining the respective inactive second trench structures 108 (outermost left and outermost right second trench structure 108 that is electrically coupled to G1), all second trench structures 108 illustrated in FIG. 4C that have the second electrode 1082 electrically coupled to the first gate terminal G1 are active second trench structures with active mesa regions M1 or M2 adjoining thereto.

Figure 5A:
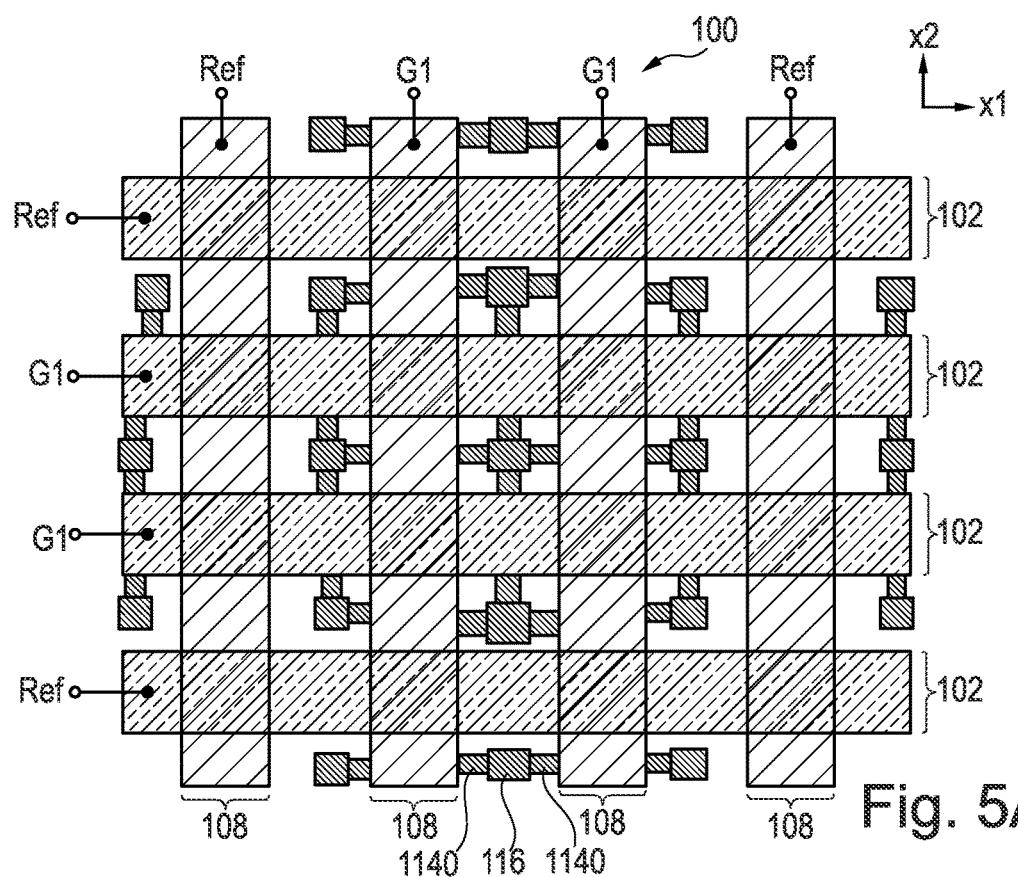
FIGS. 5A to 8B are schematic plan views for illustrating examples of power semiconductor devices configured for applications requiring fast switching.
Figure 5B:
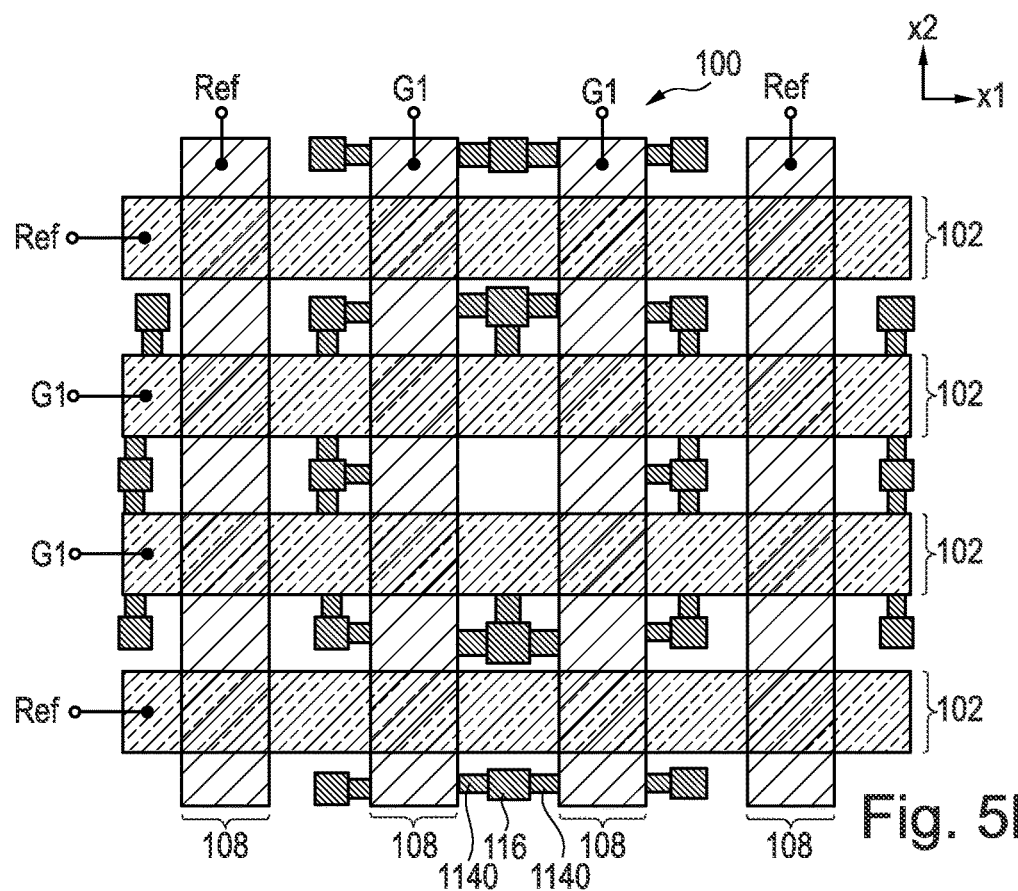
Figure 5C:
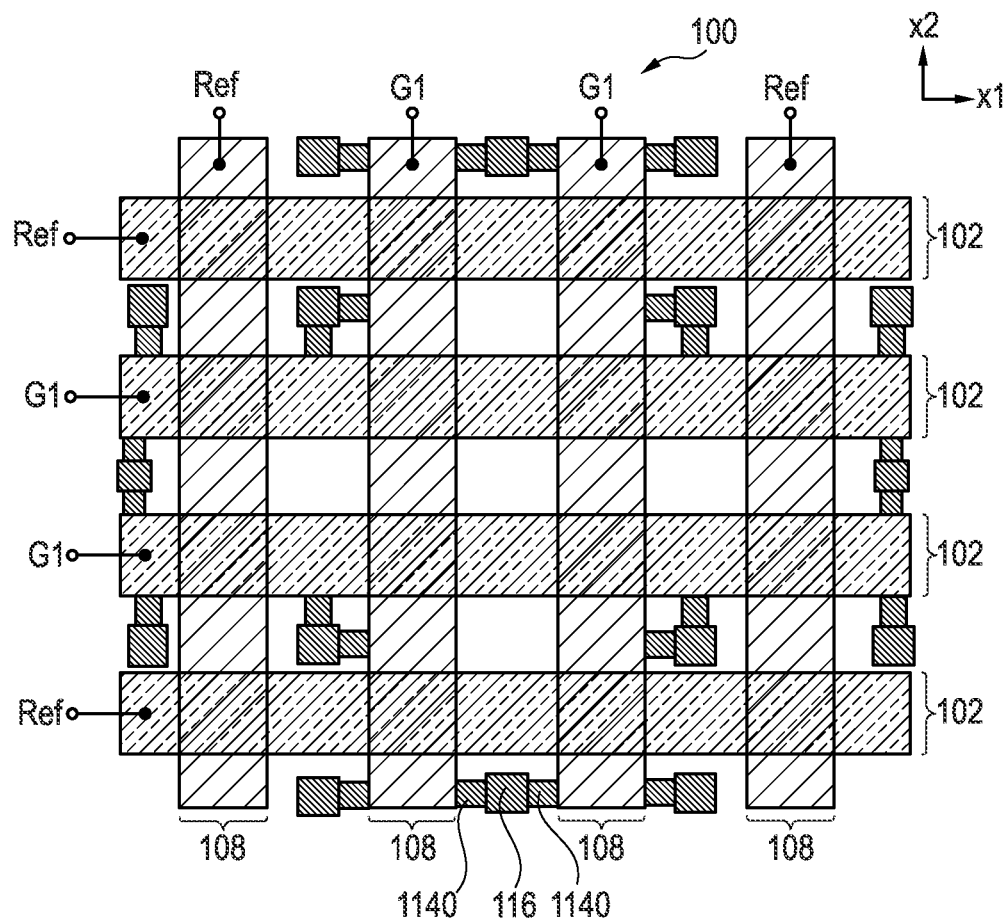

The schematic plan views of FIGS. 5A to 5C illustrate various examples of power semiconductor devices 100 having large channel widths. By consecutively arranging two or more first trench structures 102 having the first electrode electrically coupled to the first gate terminal G1, and by consecutively arranging two or more second trench structures 108 having the second electrode electrically coupled to the first gate terminal G1, a large number of active mesa regions may be concentrated by arranging source sub-regions 1140 in contact with sidewalls of the respective second trench structures 108. While a channel width decreases from the example illustrated in FIG. 5A to the example illustrated in FIG. 5B, and from the example illustrated in FIG. 5B to the example illustrated in FIG. 5C, a parasitic turn-on ruggedness may increase from the example illustrated in FIG. 5A to the example illustrated in FIG. 5B, and from the example illustrated in FIG. 5B to the example illustrated in FIG. 5C. Similarly, a latch-up ruggedness may increase from the example illustrated in FIG. 5A to the example illustrated in FIG. 5B.

Figure 6:
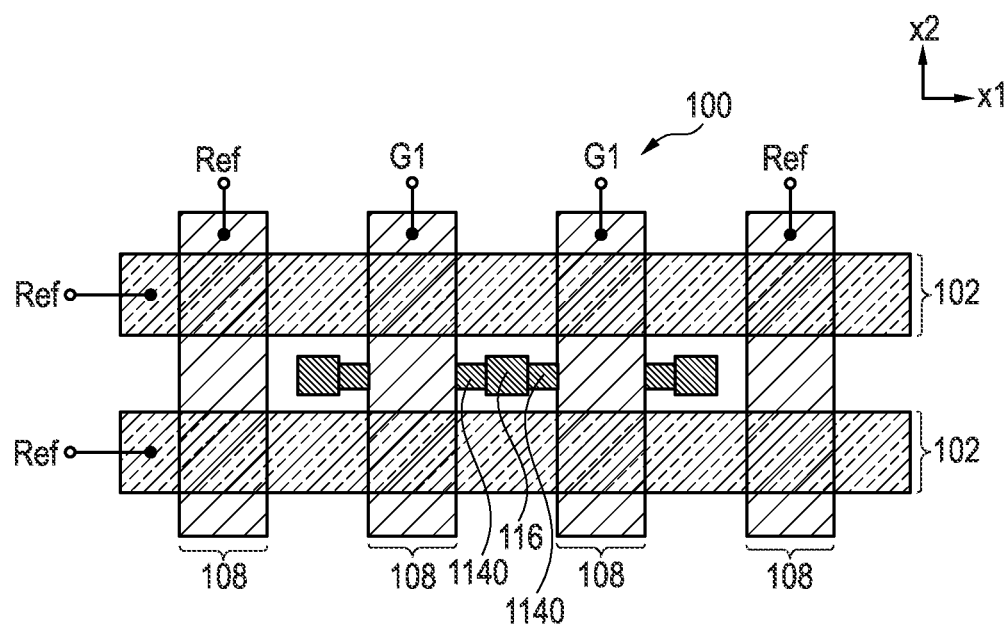

The schematic plan view of FIG. 6 illustrates an example of a power semiconductor device 100 for fast switching applications. By electrically coupling the electrodes of the first (deeper) trench structures 102 to the reference terminal Ref, a gate to collector capacitance of an IGBT may be reduced by screening the electrodes in the shallower second trench structures 108 that are electrically coupled to the first gate terminal G1. Some first trench structures 102 may also include electrodes electrically coupled to the first gate terminal G1, for example.

Figure 7:
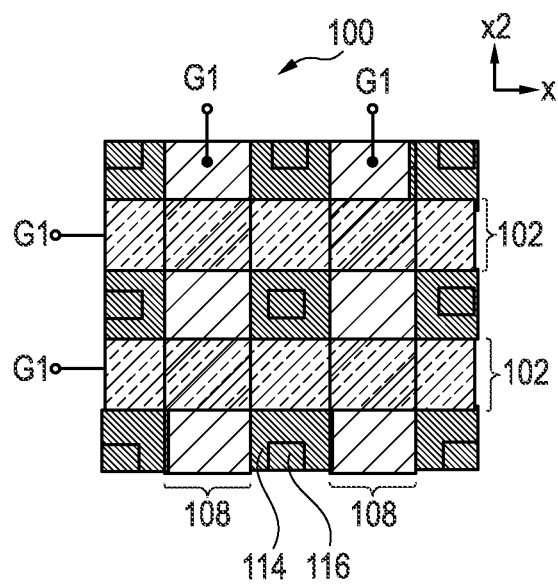

The schematic plan view of FIG. 7 illustrates another example of a power semiconductor device 100 for fast switching applications. For enlarging the channel width, a circumference of the source region 114 coincides with a circumference of the mesa region. By consecutively arranging two or more first trench structures 102 having the first electrode electrically coupled to the first gate terminal G1, and two or more second trench structures 108 having the second electrode electrically coupled to the first gate terminal G1, turn-on switching losses may be reduced.

Figure 8A:
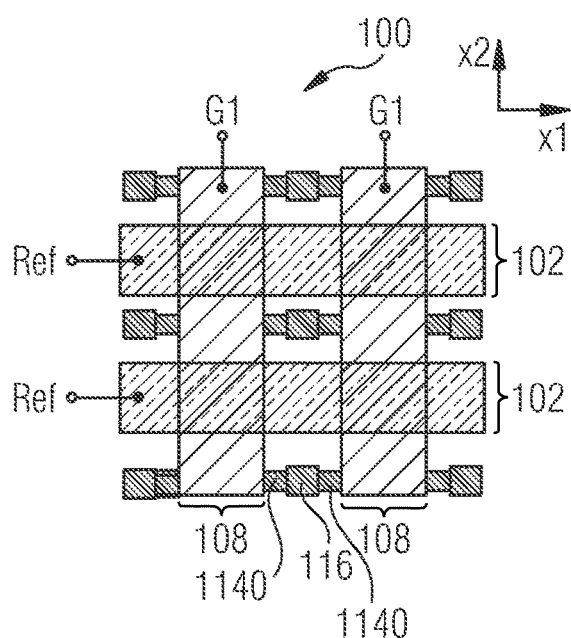

The schematic plan view of FIG. 8A illustrates another example of a power semiconductor device 100 for fast switching applications by electrically coupling the electrodes of the first (deeper) trench structures 102 to the reference terminal Ref. This may allow for reducing a gate to collector capacitance of an IGBT by screening the electrodes in the shallower second trench structures 108 that are electrically coupled to the first gate terminal G1, for example. The first gate terminal G1 may be the only gate terminal of the power semiconductor device 100. The source sub-regions 1140 are, according to the example of FIG. 8A, spaced apart from the first trench structures 102. More particularly, the source sub-regions 1140 may be arranged in a distance to the first trench structures 102 along the second lateral direction x2. The contacts 116 are, according to the example of FIG. 8A, spaced apart from the first trench structures 102. More particularly, the contacts 116 may be arranged in a distance to the first trench structures 102 along the second lateral direction x2.

Figure 8B:
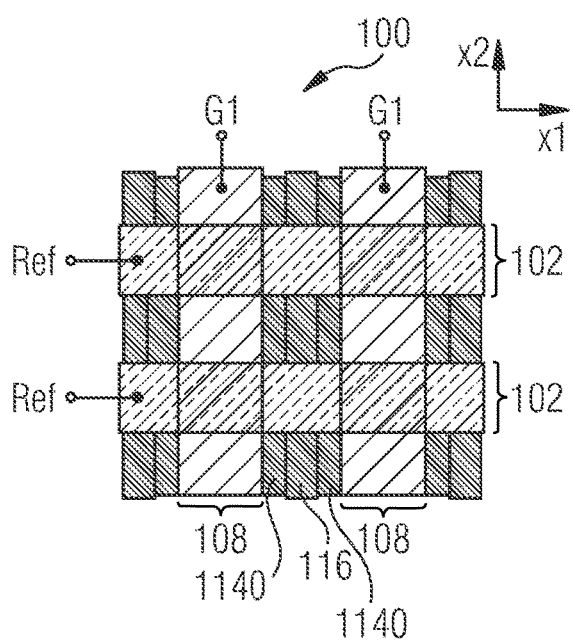

The schematic plan view of FIG. 8B illustrates another example of a power semiconductor device 100 for fast switching applications. According to the example of FIG. 8B, the electrodes of the first (deeper) trench structures 102, e.g. the respective first electrodes 1022, are electrically coupled to the reference terminal Ref. According to the example of FIG. 8B, the shallower second trench structures 108 are electrically coupled to the first gate terminal G1. The first gate terminal G1 may be the only gate terminal of the power semiconductor device 100.

In the example of FIG. 8B, each of the source sub-regions 1140 is arranged adjoining or directly adjacent to at least one of the first trench structures 102. In other words, the source sub-regions 1140 may be arranged adjoining or directly adjacent to only one or both neighboring of the first trench structures 102. For example, each of the source sub-regions 1140 may be in physical contact with the at least one of the first trench structures 102, e .g. the first dielectric 1021 and/or the first electrode 1022 of the respective first trench structure 102. By the increased size of the source sub-regions 1140 compared to FIG. 8A, conduction losses may be reduced. The design of the source sub-regions 1140 as depicted in FIG. 8A may on the other hand result in smaller dead times when compared to FIG. 8B.

In the example of FIG. 8B, each of the contacts 116 is arranged adjoining or directly adjacent to at least one of the first trench structures 102. In other words, the contacts 116 may be arranged adjoining or directly adjacent to only one or both neighboring of the first trench structures 102. For example, each of the contacts 116 may be in physical contact with the at least one of the trench structures 102, e.g. the first dielectric 1021 and/or the first electrode 1022 of the respective trench structure 102. Furthermore, each of the contacts 116 may be in electric connection with the at least one of the trench structures 102, e .g. the first electrode 1022 of the respective trench structure 102, along a lateral direction, e. g. the second lateral direction x2. The electric connection may, for example, be an ohmic contact. Therefore, the first electrode 1022 may be connected to the reference terminal Ref, which may be the source terminal or first load terminal, at least partly by the contacts 116 also connecting the source sub-regions 1140 and the body region 112. The first dielectric 1021 of the respective trench structures 102 may comprise an opening, e. g. in a sidewall of the first dielectric 1021, for said electric connection. Said electrical connection between the contacts 116 and the first dielectric 1021 of the respective trench structures 102 may be arranged at least partly within the semiconductor body 106 and/or below the first main surface 104.

Figure 9:
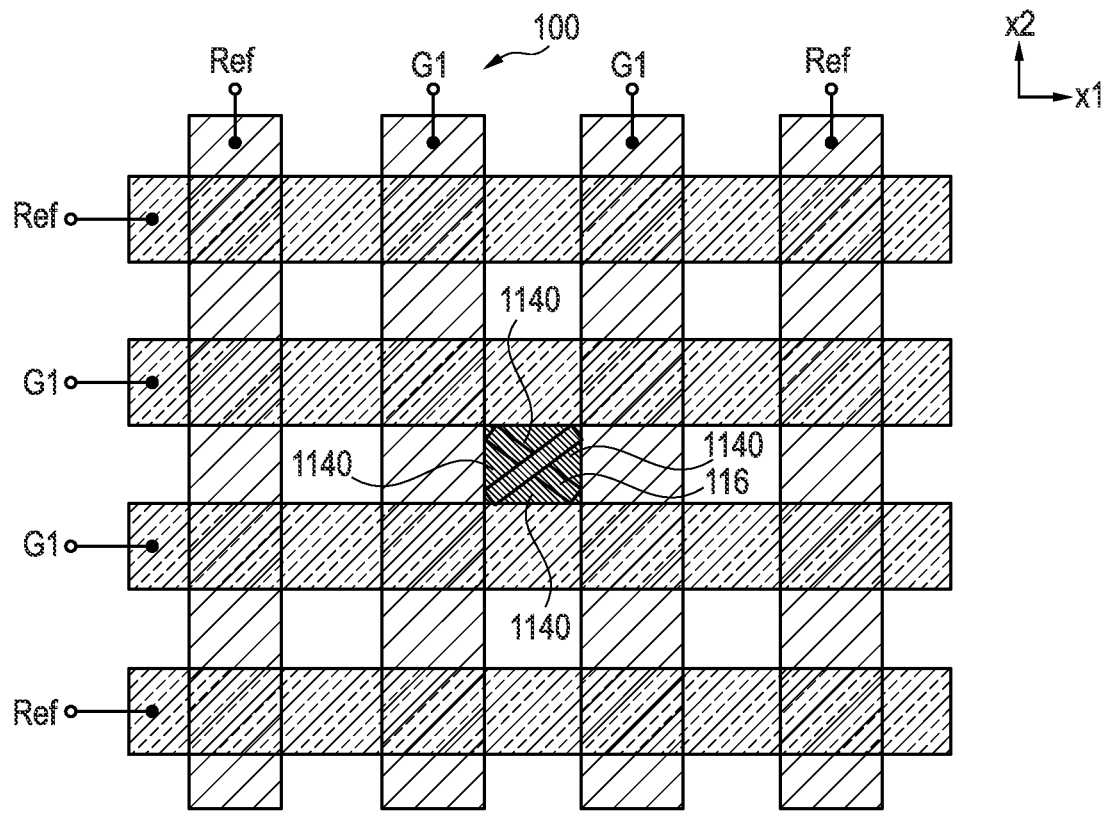
FIG. 9 is a schematic plan view for illustrating an example of a power semiconductor device including a mesa region having four source sub-regions and a cross-shaped mesa contact.

The schematic plan view of FIG. 9 illustrates another example of a power semiconductor device 100. The power semiconductor device includes a mesa region having four source sub-regions 1140. The four source sub-regions 1140 are separated by a contact 116 in the shape of a cross or two crossing diagonal lines between diagonal corners of the mesa region.

Figure 10:
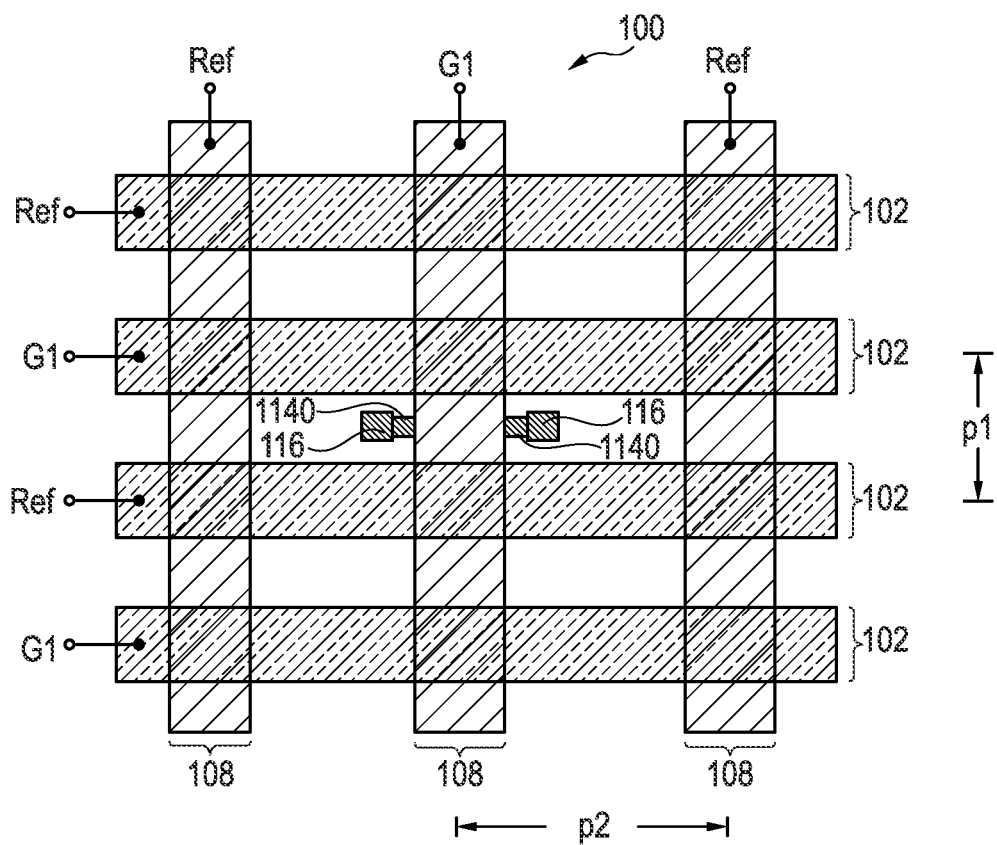
FIG. 10 is a schematic plan view for illustrating an example of a power semiconductor device having a first pitch between the first trench structures that differs from a second pitch between the second trench structures.

In the examples described herein, first a first pitch p1 between neighboring first trench structures 102 may be constant or may vary, at least in part, among first trench structures 102. Likewise, a second pitch p2 between neighboring second trench structures 108 may be constant or may vary, at least in part, among second trench structures 108. The schematic plan view of FIG. 10 illustrates an example of a power semiconductor device 100 having the first pitch p1 smaller than the second pitch p2. The first pitch may also be larger than the second pitch, or may also be equal to the second pitch. The electrodes in the first trench structures 102 may also be connected in a different sequence than the sequence Ref, G1, Ref, G1 illustrated in FIG. 10, e.g. in a sequence G1, Ref, Ref, G1, or in a sequence Ref, G1, G1, Ref.

It will be appreciated that while the method is described above and below as a series of steps or events, the described ordering of such steps or events are not to be interpreted in a limiting sense. Rather, some steps may occur in different orders and/or concurrently with other steps or events apart from those described above and below.

An exemplary method of manufacturing power semiconductor devices 100 is illustrated in the schematic cross-sectional views of FIGS. 11 to 18D. The cross-sectional views are illustrated with respect to one or more of the intersecting lines AA', BB', CC', DD' illustrated in FIG. 1.

Figures 11, 12:
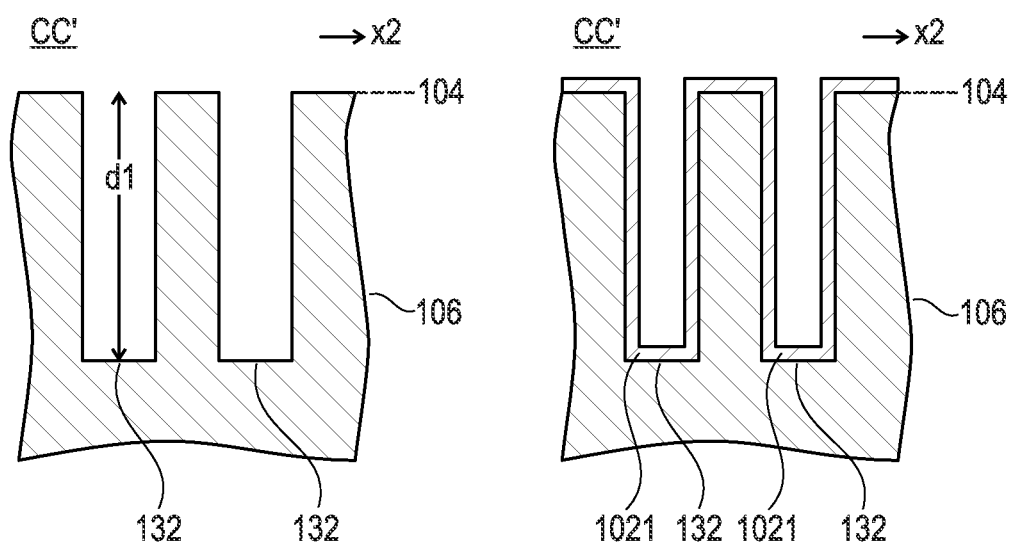
Figure 18A:
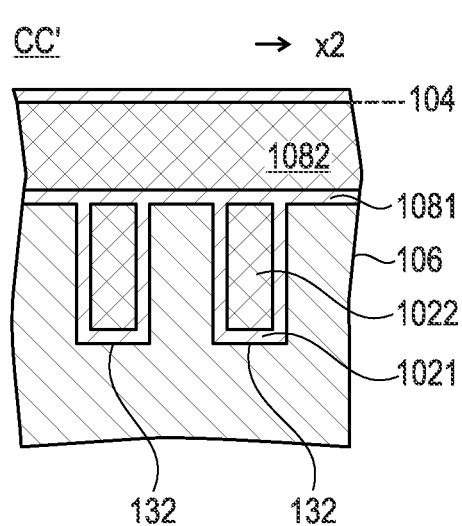
Figure 18B:
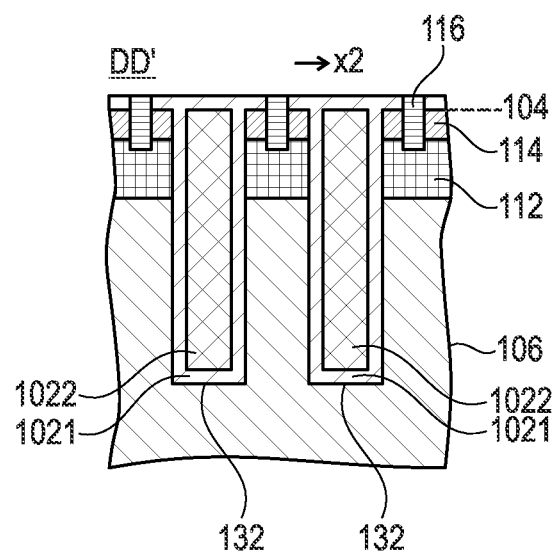
Figure 18C:
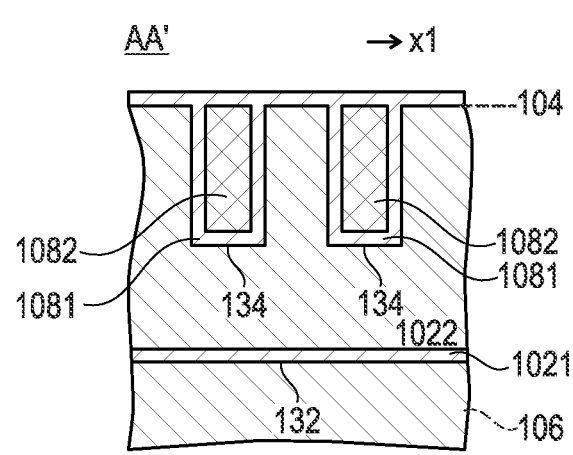
Figure 18D:
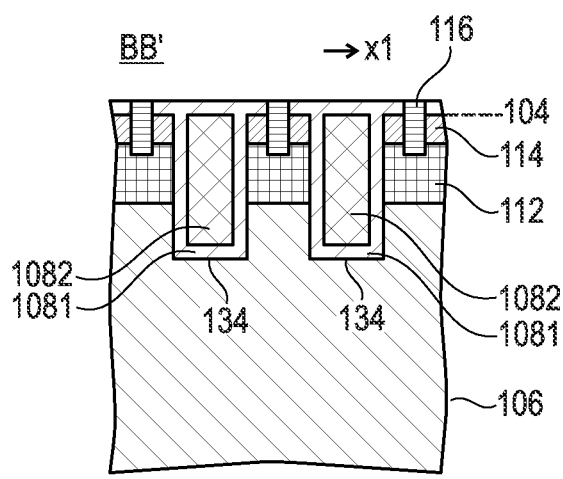

Referring to FIG. 11, first trenches 132 are formed in the semiconductor body 106 up to a first depth d1 by one or more etch processes. An etch mask (not illustrated) may be used.

Referring to FIG. 12, the first dielectric 1021 is formed in the first trenches 132 by one or more dielectric layer deposition or thermal oxidation processes.

Referring to FIG. 13, the first electrode 1022 is formed in the first trenches 132 by one or more deposition processes of conductive materials, e.g. highly doped polycrystalline silicon. The conductive material(s) may be recessed up to the first dielectric 1021 at the first main surface 104.

Referring to FIGS. 14A, 14B, 14C, 14D, second trenches 134 are formed in the semiconductor body 106 up to a second depth d2 by one or more etch processes. An etch mask (not illustrated) may be used. At the intersection positions 110, the first dielectric 1021 and the first electrode 1022 are partly removed. Outside of the intersection positions 110, material of the semiconductor body 106 is removed.

Referring to FIGS. 15A, 15B, 15C, 15D, the second dielectric 1081 is formed in the second trenches 134 by one or more dielectric layer deposition or thermal oxidation processes. Depending on rates of dielectric layer formation or thermal oxidation, a thickness of the second dielectric 1081 at the intersection positions 110 may differ from a thickness of the second dielectric 1081 outside the intersection positions 110. For example, when forming the first electrode 1022 of polycrystalline silicon material and the second dielectric 1081 of oxide material, a thickness t1 of the second dielectric 1081 at the intersection positions 110 may be larger than a thickness t2 of the second dielectric 1081 outside the intersection positions 110 due to higher oxidation rates of polycrystalline silicon than single crystalline silicon in the semiconductor body 106.

Referring to FIGS. 16A, 16B, 16C, 16D, the second electrode 1082 is formed in the second trenches 134 by one or more deposition processes of conductive materials, e.g. highly doped polycrystalline silicon. The conductive material(s) may be recessed up to the first main surface 104.

Referring to FIGS. 17A, 17B, 17C, 17D, p- and n-type dopants are introduced into the semiconductor body 106 for forming the body regions 112 and the source regions 114. The dopants may be introduced into the semiconductor body by one or more ion implantation processes.

Referring to FIGS. 18A, 18B, 18C, 18D, the contacts 116 are formed by forming contact grooves into the semiconductor body 116 and filling the contact grooves with one or more conductive materials.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor device, comprising:
a plurality of first trench structures extending from a first main surface into a semiconductor body up to a first depth, wherein the plurality of first trench structures extend in parallel along a first lateral direction, and each of the plurality of first trench structures includes a first dielectric and a first electrode; and
a plurality of second trench structures extending from the first main surface into the semiconductor body up to a second depth that is smaller than the first depth,
wherein the plurality of second trench structures extend in parallel along a second lateral direction and intersect the plurality of first trenches at intersection positions,
wherein each of the plurality of second trench structures includes a second dielectric and a second electrode,
wherein the second dielectric is arranged between the first electrode and the second electrode at the intersection positions.

2. The power semiconductor device of claim 1, wherein the first lateral direction is perpendicular to the second lateral direction.

3. The power semiconductor device of claim 1, wherein a crossing angle between the first lateral direction and the second lateral direction is larger than 45° and smaller than 90°.

4. The power semiconductor device of claim 1, wherein a thickness of the second dielectric at the intersection positions is larger than a thickness of the first dielectric.

5. The power semiconductor device of claim 1, wherein the first electrode in a first group of the plurality of first trench structures and the first electrode in a second group of the plurality of first trench structures are electrically disconnected.

6. The power semiconductor device of claim 1, wherein the first electrode in the first group of the plurality of first trench structures is a gate electrode electrically connected to a first gate terminal, and wherein the first electrode in the second group of the plurality of first trench structures is an electrode electrically connected to a reference terminal.

7. The power semiconductor device of claim 1, wherein the second electrode in a first group of the plurality of second trench structures and the second electrode in a second group of the plurality of second trench structures are electrically disconnected.

8. The power semiconductor device of claim 7, wherein the second electrode in the first group of the plurality of second trench structures is a gate electrode electrically connected to a first gate terminal.

9. The power semiconductor device of claim 8, wherein the second electrode in the second group of the plurality of second trench structures is an electrode electrically connected to a reference terminal.

10. The power semiconductor device of claim 1, wherein the first electrode in a first group of the plurality of first trench structures is a first gate electrode electrically connected to a first gate terminal, and wherein the second electrode in a first group of the plurality of second trench structures is a second gate electrode electrically connected to a second gate terminal.

11. The power semiconductor device of claim 10, further comprising a gate driver, wherein the gate driver is configured to:
drive the first gate electrode by a first gate driving signal; and
drive the second gate electrode by a second gate driving signal,
wherein a rising edge of the first gate driving signal and a rising edge of the second gate driving signal are offset by a first delay time period.

12. The power semiconductor device of claim 11, wherein a falling edge of the first gate driving signal and a falling edge of the second gate driving signal are offset by a second delay time period.

13. The power semiconductor device of claim 1, further comprising a plurality of mesa regions, wherein each of the plurality of mesa regions is laterally confined along the second lateral direction by neighboring two of the plurality of first trench structures, and is further laterally confined along the first lateral direction by neighboring two of the plurality of second trench structures, and wherein at least some of the plurality of mesa regions differ in at least one of an electric contact on the mesa region and a number of source-sub regions arranged in the mesa region.

14. The power semiconductor device of claim 13, wherein at least one of the plurality of mesa regions includes a number of n source sub-regions, n being an integer ranging from 1 to 4, and, for $2 \leq n \leq 4$, and wherein the n source sub-regions directly adjoin to different ones of the plurality of first and second trench structures.

15. The power semiconductor device of claim 13, wherein at least one of the plurality of mesa regions includes a source region, and wherein a circumference of the source region at the first main surface coincides with a circumference of the mesa region at the first main surface.

16. The power semiconductor device of claim 13, wherein at least one of the plurality of mesa regions includes four source sub-regions, and wherein the four source sub-regions are separated at the first main surface by a contact in the shape of a cross.

17. The power semiconductor device of claim 1, wherein a first pitch between the plurality of first trench structures differs from a second pitch between the plurality of second trench structures.

18. The power semiconductor device of claim 1, wherein each of the first electrodes is electrically coupled to a reference terminal and each of the second electrodes is electrically coupled to a first gate terminal.

19. The power semiconductor device of claim 1, wherein each of a plurality of source sub-regions is adjoining at least one of the first trench structures.

20. The power semiconductor device of claim 19, wherein a plurality of contacts for connecting the plurality of source sub-regions is adjoining at least one of the first trench structures and/or in electric connection with a respective one of the first electrodes along the second lateral direction.

21. A method of manufacturing a power semiconductor device, the method comprising:
forming a plurality of first trench structures extending from a first main surface into a semiconductor body up to a first depth, wherein the plurality of first trench structures extend in parallel along a first lateral direction, and each of the plurality of first trench structures includes a first dielectric and a first electrode; and forming a plurality of second trench structures extending from the first main surface into the semiconductor body up to a second depth that is smaller than the first depth, wherein the plurality of second trench structures extend in parallel along a second lateral direction and intersect the plurality of first trenches at intersection positions, wherein each of the plurality of second trench structures includes a second dielectric and a second electrode, wherein the second dielectric is arranged between the first electrode and the second electrode at the intersection positions.

22. The method of claim 21, wherein forming the plurality of second trench structures includes forming a plurality of second trenches by etching a part of the first electrode and the first dielectric and a part of the semiconductor body.

23. The method of claim 21, further comprising forming source and body regions after forming the first and second trench structures.

* * * * *